United States Patent
Tran et al.

(10) Patent No.: US 9,286,982 B2
(45) Date of Patent: Mar. 15, 2016

(54) FLASH MEMORY SYSTEM WITH EEPROM FUNCTIONALITY

(71) Applicant: Silicon Storage Technology, Inc., San Jose, CA (US)

(72) Inventors: Hieu Van Tran, San Jose, CA (US); Hung Quoc Nguyen, Fremont, CA (US); Nhan Do, Saratoga, CA (US); Vipin Tiwari, Dublin, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 14/455,698

(22) Filed: Aug. 8, 2014

(65) Prior Publication Data

US 2016/0042790 A1 Feb. 11, 2016

(51) Int. Cl.

| | |
|---|---|
| *G11C 16/14* | (2006.01) |
| *G11C 16/16* | (2006.01) |
| *G11C 5/06* | (2006.01) |
| *G11C 16/04* | (2006.01) |
| *G11C 16/08* | (2006.01) |
| *G11C 16/24* | (2006.01) |
| *G11C 16/10* | (2006.01) |
| *G11C 16/26* | (2006.01) |
| *H01L 29/423* | (2006.01) |
| *H01L 27/115* | (2006.01) |
| *G11C 5/02* | (2006.01) |

(52) U.S. Cl.
CPC ........ *G11C 16/0433* (2013.01); *G11C 16/0483* (2013.01); *G11C 16/08* (2013.01); *G11C 16/102* (2013.01); *G11C 16/14* (2013.01); *G11C 16/24* (2013.01); *G11C 16/26* (2013.01); *H01L 27/11524* (2013.01); *H01L 29/42328* (2013.01); *G11C 5/02* (2013.01); *G11C 5/06* (2013.01); *G11C 16/16* (2013.01)

(58) Field of Classification Search
CPC .... G11C 16/14; G11C 16/0483; G11C 16/16; G11C 5/02; G11C 5/06
USPC .......................... 365/185.29, 185.18, 185.05
See application file for complete search history.

(56) References Cited

U.S. PATENT DOCUMENTS

| | | | |
|---|---|---|---|
| 5,604,711 A * | 2/1997 | Cheung | 365/230.06 |
| 5,719,818 A * | 2/1998 | Tovim et al. | 365/230.06 |
| 6,055,203 A * | 4/2000 | Agarwal et al. | 365/230.06 |
| 2007/0127292 A1* | 6/2007 | Sakui et al. | 365/185.17 |
| 2011/0199830 A1* | 8/2011 | Lee et al. | 365/185.18 |
| 2012/0011300 A1* | 1/2012 | Hung et al. | 711/103 |
| 2012/0051147 A1* | 3/2012 | Lin et al. | 365/185.29 |
| 2012/0063223 A1* | 3/2012 | Lee et al. | 365/185.02 |
| 2012/0134203 A1* | 5/2012 | Miura et al. | 365/163 |
| 2012/0154370 A1* | 6/2012 | Russell et al. | 345/214 |
| 2013/0148428 A1* | 6/2013 | Tran et al. | 365/185.18 |
| 2013/0182509 A1* | 7/2013 | Lee et al. | 365/185.22 |
| 2014/0198571 A1* | 7/2014 | Wu et al. | 365/185.05 |

* cited by examiner

*Primary Examiner* — Ly D Pham

(74) *Attorney, Agent, or Firm* — DLA Piper LLP (US)

(57) ABSTRACT

The present invention relates to a flash memory device with EEPROM functionality. The flash memory device is byte-erasable and bit-programmable.

84 Claims, 25 Drawing Sheets

FLASH MEMORY SYSTEM WITH EEPROM FUNCTIONALITY

TECHNICAL FIELD

The present invention relates to a flash memory device with EEPROM functionality. The flash memory device is byte-erasable and bit-programmable.

BACKGROUND OF THE INVENTION

Non-volatile memory cells are well known in the art. A first type of prior art non-volatile memory cell 110 is shown in FIG. 1. The memory cell 110 comprises a semiconductor substrate 112 of a first conductivity type, such as P type. The substrate 112 has a surface on which there is formed a first region 114 (also known as the source line SL) of a second conductivity type, such as N type. A second region 116 (also known as the drain line) also of N type is formed on the surface of the substrate 112. Between the first region 114 and the second region 116 is a channel region 118. A bit line BL 120 is connected to the second region 116. A word line WL 122 is positioned above a first portion of the channel region 118 and is insulated therefrom. The word line 122 has little or no overlap with the second region 116. A floating gate FG 124 is over another portion of the channel region 118. The floating gate 124 is insulated therefrom, and is adjacent to the word line 122. The floating gate 124 is also adjacent to the first region 114. The floating gate 124 may overlap the first region 114 significantly to provide strong coupling from the region 114 into the floating gate 124.

One exemplary operation for erase and program of prior art non-volatile memory cell 110 is as follows. The cell 110 is erased, through a Fowler-Nordheim tunneling mechanism, by applying a high voltage on the word line 122 and zero volts to the bit line and source line. Electrons tunnel from the floating gate 124 into the word line 122 causing the floating gate 124 to be positively charged, turning on the cell 110 in a read condition. The resulting cell erased state is known as '1' state. The cell 110 is programmed, through a source side hot electron programming mechanism, by applying a high voltage on the source line 114, a small voltage on the word line 122, and a programming current on the bit line 120. A portion of electrons flowing across the gap between the word line 122 and the floating gate 124 acquire enough energy to inject into the floating gate 124 causing the floating gate 124 to be negatively charged, turning off the cell 110 in read condition. The resulting cell programmed state is known as '0' state.

Exemplary voltages that can be used for the read, program, erase, and standby operations in memory cell 110 is shown below in Table 1:

TABLE 1

| Operation | WL | BL | SL |
|---|---|---|---|
| Read | Vwlrd | Vblrd | 0 V |
| Program | Vwlp | Iprog/Vinh (unsel) | Vslp |
| Erase | Vwler | 0 V | 0 V |
| Standby | 0 V | 0 V | 0 V |

Vwlrd ~2-3 V
Vblrd ~0.8-2 V
Vwlp ~1-2 V
Vwler ~11-13 V
Vslp ~9-10 V
Iprog ~1-3 ua
Vinh ~2 V A second type of prior art non-volatile memory cell 210 is shown in FIG. 2. The memory cell 210 comprises a semiconductor substrate 212 of a first conductivity type, such as P type. The substrate 212 has a surface on which there is formed a first region 214 (also known as the source line SL) of a second conductivity type, such as N type. A second region 216 (also known as the drain line) also of N type is formed on the surface of the substrate 212. Between the first region 214 and the second region 216 is a channel region 218. A bit line BL 220 is connected to the second region 216. A word line WL 222 is positioned above a first portion of the channel region 218 and is insulated therefrom. The word line 222 has little or no overlap with the second region 216. A floating gate FG 224 is over another portion of the channel region 218. The floating gate 224 is insulated therefrom, and is adjacent to the word line 222. The floating gate 224 is also adjacent to the first region 214. The floating gate 224 may overlap the first region 214 to provide coupling from the region 214 into the floating gate 224. A coupling gate CG (also known as control gate) 226 is over the floating gate 224 and is insulated therefrom.

One exemplary operation for erase and program of prior art non-volatile memory cell 210 is as follows. The cell 210 is erased, through a Fowler-Nordheim tunneling mechanism, by applying a high voltage on the word line 222 with other terminals equal to zero volt. Electrons tunnel from the floating gate 224 into the word line 222 to be positively charged, turning on the cell 210 in a read condition. The resulting cell erased state is known as '1' state. The cell 210 is programmed, through a source side hot electron programming mechanism, by applying a high voltage on the coupling gate 226, a high voltage on the source line 214, and a programming current on the bit line 220. A portion of electrons flowing across the gap between the word line 222 and the floating gate 224 acquire enough energy to inject into the floating gate 224 causing the floating gate 224 to be negatively charged, turning off the cell 210 in read condition. The resulting cell programmed state is known as '0' state.

Exemplary voltages that can be used for the read, program, erase, and standby operations in memory cell 210 is shown below in Table 2:

TABLE 2

| Operation | WL | WL-unselect | BL | BL-unselect | CG | CG-unselect same sector | CG-unselect | SL | SL-unselect |
|---|---|---|---|---|---|---|---|---|---|
| Read | 1.0-3 V | 0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | 0 V | 1 uA | Vinh | 8-11 V | 0-2.6 V | 0-2.6 V | 4.5-5 V | 0-1 V |

Another set of exemplary voltages (when a negative voltage is available for read and program operations) that can be used for the read, program, and erase operations in memory cell 210 is shown below in Table 3:

TABLE 3

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5 V/ 0 V | 0.6-2 V | 0 V | 0-2.6 V | 0-2.6 V | 0-2.6 V | 0 V | 0 V |
| Erase | 11-10 V | 0 V | 0 V | 0 V | 0 V | 0 V | 0 V | 0 V | 0 V |
| Program | 1 V | −0.5 V/ 0 V | 1 uA | Vinh | 8-11 V | 0-2.6 V | 0-2.6 V | 4.5-5 V | 0-1 V |

Another set of exemplary voltages (when a negative voltage is available for read, program, and erase operations) that can be used for the read, program, and erase operations in memory cell 210 is shown below in Table 4:

TABLE 4

| Operation | WL | WL-unselect | BL | BL-unselect | CG | CG-unselect same sector | CG-unselect | SL | SL-unselect |
|---|---|---|---|---|---|---|---|---|---|
| Read | 1.0-2 V | −0.5 V/ 0 V | 0.6-2 V | 0 V | 0-2.6 V | 0-2.6 V | 0-2.6 V | 0 V | 0 V |
| Erase | 9-6 V | −0.5 V/ 0 V | 0 V | 0 V | −(5-9) V | 0 V | 0 V | 0 V | 0 V |
| Program | 1 V | −0.5 V/ 0 V | 1 uA | Vinh | 8-9 V | 0-2.6 V | 0-2.6 V | 4.5-5 V | 0-1 V |

A third type of non-volatile memory cell 310 is shown in FIG. 3. The memory cell 310 comprises a semiconductor substrate 312 of a first conductivity type, such as P type. The substrate 312 has a surface on which there is formed a first region 314 (also known as the source line SL) of a second conductivity type, such as N type. A second region 316 (also known as the drain line) also of N type is formed on the surface of the substrate 312. Between the first region 314 and the second region 316 is a channel region 318. A bit line BL 320 is connected to the second region 316. A word line WL 322 is positioned above a first portion of the channel region 318 and is insulated therefrom. The word line 322 has little or no overlap with the second region 316. A floating gate FG 324 is over another portion of the channel region 318. The floating gate 324 is insulated therefrom, and is adjacent to the word line 322. The floating gate 324 is also adjacent to the first region 314. The floating gate 324 may overlap the first region 314 to provide coupling from the region 314 into the floating gate 324. A coupling gate CG (also known as control gate) 326 is over the floating gate 324 and is insulated therefrom. An erase gate EG 328 is over the first region 314 and is adjacent to the floating gate 324 and the coupling gate 326 and is insulated therefrom. The top corner of the floating gate 324 may point toward the inside corner of the T-shaped erase gate 328 to enhance erase efficiency. The erase gate 328 is also insulated from the first region 314. The cell 310 is more particularly described in U.S. Pat. No. 7,868,375 whose disclosure is incorporated herein by reference in its entirety.

One exemplary operation for erase and program of prior art non-volatile memory cell 310 is as follows. The cell 310 is erased, through a Fowler-Nordheim tunneling mechanism, by applying a high voltage on the erase gate 328 with other terminals equal to zero volt. Electrons tunnel from the floating gate 324 into the erase gate 328 causing the floating gate 324 to be positively charged, turning on the cell 310 in a read condition. The resulting cell erased state is known as '1' state. The cell 310 is programmed, through a source side hot electron programming mechanism, by applying a high voltage on the coupling gate 326, a high voltage on the source line 314, a medium voltage on the erase gate 328, and a programming current on the bit line 320. A portion of electrons flowing across the gap between the word line 322 and the floating gate 324 acquire enough energy to inject into the floating gate 324 causing the floating gate 324 to be negatively charged, turning off the cell 310 in read condition. The resulting cell programmed state is known as '0' state.

Exemplary voltages that can be used for the read, program, and erase operations in memory cell 310 is shown below in Table 5:

TABLE 5

| Operation | WL | WL-unsel | BL | BL-unsel | CG | CG-unsel same sector | CG-unselect | EG | EG-unsel | SL | SL-unsel |
|---|---|---|---|---|---|---|---|---|---|---|---|
| Read | 1.0-2 V | 0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |

TABLE 5-continued

| Operation | WL | WL-unsel | BL | BL-unsel | CG | CG-unsel same sector | CG-unselect | EG | EG-unsel | SL | SL-unsel |
|---|---|---|---|---|---|---|---|---|---|---|---|
| Program | 1 V | 0 V | 1 uA | Vinh | 10-11 V | 0-5 V | 0-2.6 V | 4.5-8 V | 0-2.6 V | 4.5-5 V | 0-1 V |

For programming operation, the EG voltage can be applied much higher, e.g. 8V, than the SL voltage, e.g., 5V, to enhance the programming operation. In this case, the unselected CG program voltage is applied at a higher voltage (CG inhibit voltage), e.g. 6V, to reduce unwanted erase effect of the adjacent memory cells sharing the same EG gate of the selected memory cells.

Another set of exemplary voltages (when a negative voltage is available for read and program operations) that can be used for the read, program, and erase operations in memory cell 310 is shown below in Table 6:

TABLE 6

| Operation | WL | WL-unsel | BL | BL-unsel | CG | CG-unsel same sector | CG-unselect | EG | EG-unsel | SL | SL-unsel |
|---|---|---|---|---|---|---|---|---|---|---|---|
| Read | 1.0-2 V | -0.5 V/0 V | 0.6-2 V | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0 V | 0 V | 11.5-12 V | 0-2.6 V | 0 V | 0 V |
| Program | 1 V | -0.5 V/0 V | 1 uA | Vinh | 10-11 V | 0-2.6 V | 0-2.6 V | 4.5-5 V | 0-2.6 V | 4.5-5 V | 0-1 V |

Another set of exemplary voltages (when a negative voltage is available for read, program, and erase operations) that can be used for the read, program, and erase operations in memory cell 310 is shown below in Table 7:

TABLE 7

| Operation | WL | WL-unsel | BL | BL-unsel | CG | CG-unsel same sector | CG-unselect | EG | EG-unsel | SL | SL-unsel |
|---|---|---|---|---|---|---|---|---|---|---|---|
| Read | 1.0-2 V | -0.5 V/0 V | 0.6-2 V | 0 V | 0-2.6 V | 0-2.6 V | 0-2.6 V | 0-2.6 V | 0-2.6 V | 0 V | 0 V |
| Erase | 0 V | -0.5 V/0 V | 0 V | 0 V | -(5-9) V | 0 V | 0 V | 9-8 V | 0-2.6 V | 0 V | 0 V |
| Program | 1 V | -0.5 V/0 V | 1 uA | Vinh | 8-9 V | 0-5 V | 0-2.6 V | 8-9 V | 0-2.6 V | 4.5-5 V | 0-1 V |

For programming operation, the EG voltage is applied much higher, e.g. 8-9V, than the SL voltage, e.g., 5V, to enhance the programming operation. In this case, the unselected CG program voltage is applied at a higher voltage (CG inhibit voltage), e.g. 5V, to reduce unwanted erase effects of the adjacent memory cells sharing the same EG gate of the selected memory cells.

Memory cells of the types shown in FIGS. 1-3 typically are arranged into rows and columns to form an array. Erase operations are performed on entire rows or pairs of rows at one time, since word lines control entire rows of memory cells and erase gates (of the type shown in FIG. 3), when present, are shared by pairs of rows of memory cells. Thus, in prior art memory systems using memory cells of the types shown in FIGS. 1-3, it has not been possible to erase only one byte of data or one byte pair of data at a time.

Also known in the prior art are electrically erasable programmable read only memory (EEPROM) devices. As with the flash memory cells of FIGS. 1-3, EEPROM devices are non-volatile memory devices. However, in an EEPROM device, cells can be erased one byte at a time, unlike in the systems utilizing the memory cells of FIGS. 1-3. EEPROM cell size is typically much larger than flash memory cell size.

What is needed is a flash memory device that can be erased on a byte-by-byte basis, similar to what is possible in EEPROM devices. Advantages includes flash memory functionality (such as high density memory with a sector erasable feature) and EEPROM functionality (low density memory with a byte erasable feature) exists on same process.

SUMMARY OF THE INVENTION

In the embodiments described below, flash memory arrays can be erased on a byte-by-byte basis.

DETAILED DESCRIPTION OF THE PREFERRED EMBODIMENT

Figure 1:
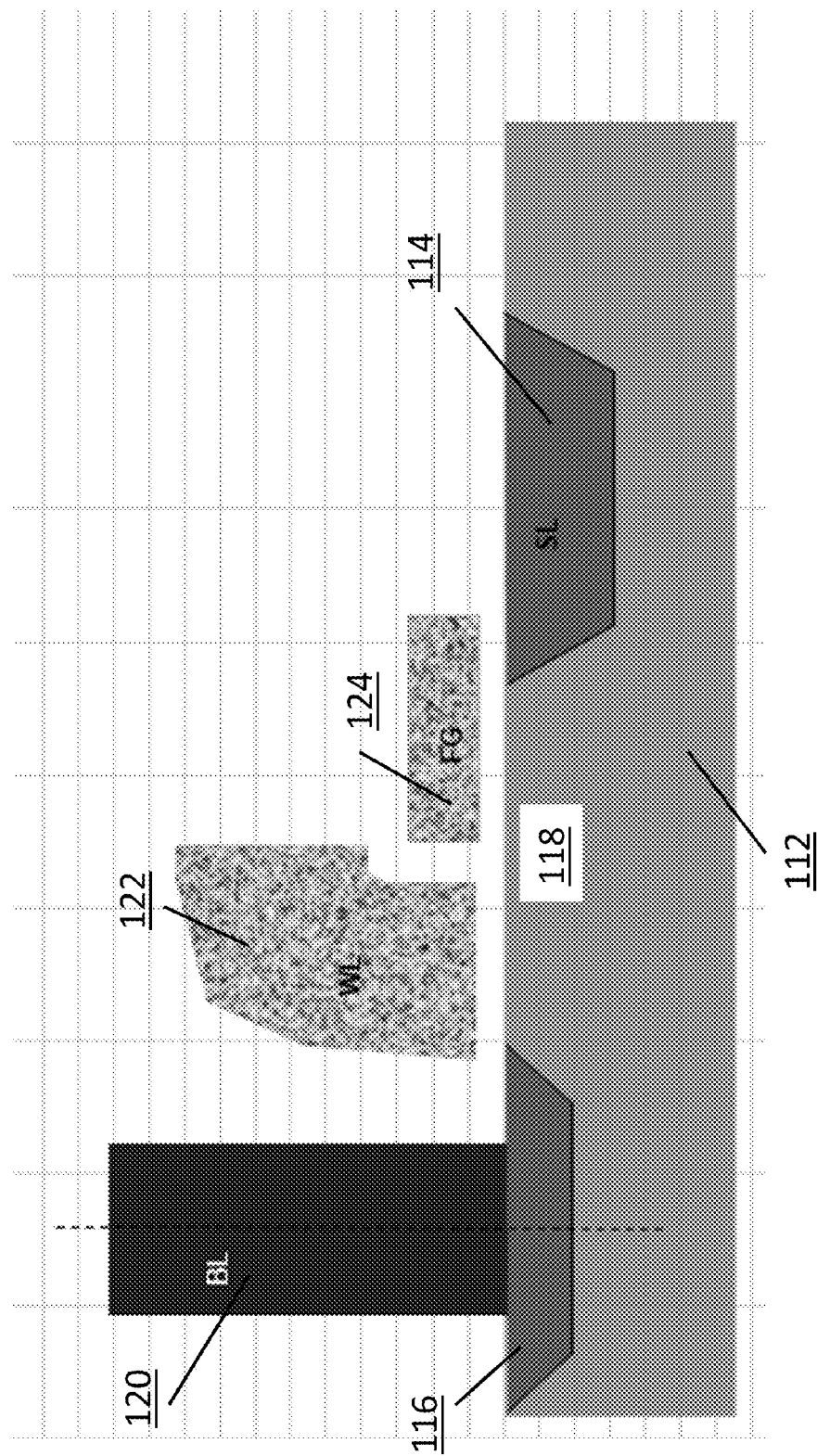
FIG. 1 is a cross-sectional view of a non-volatile memory cell of the prior art to which the method of the present invention can be applied.
Figure 2:
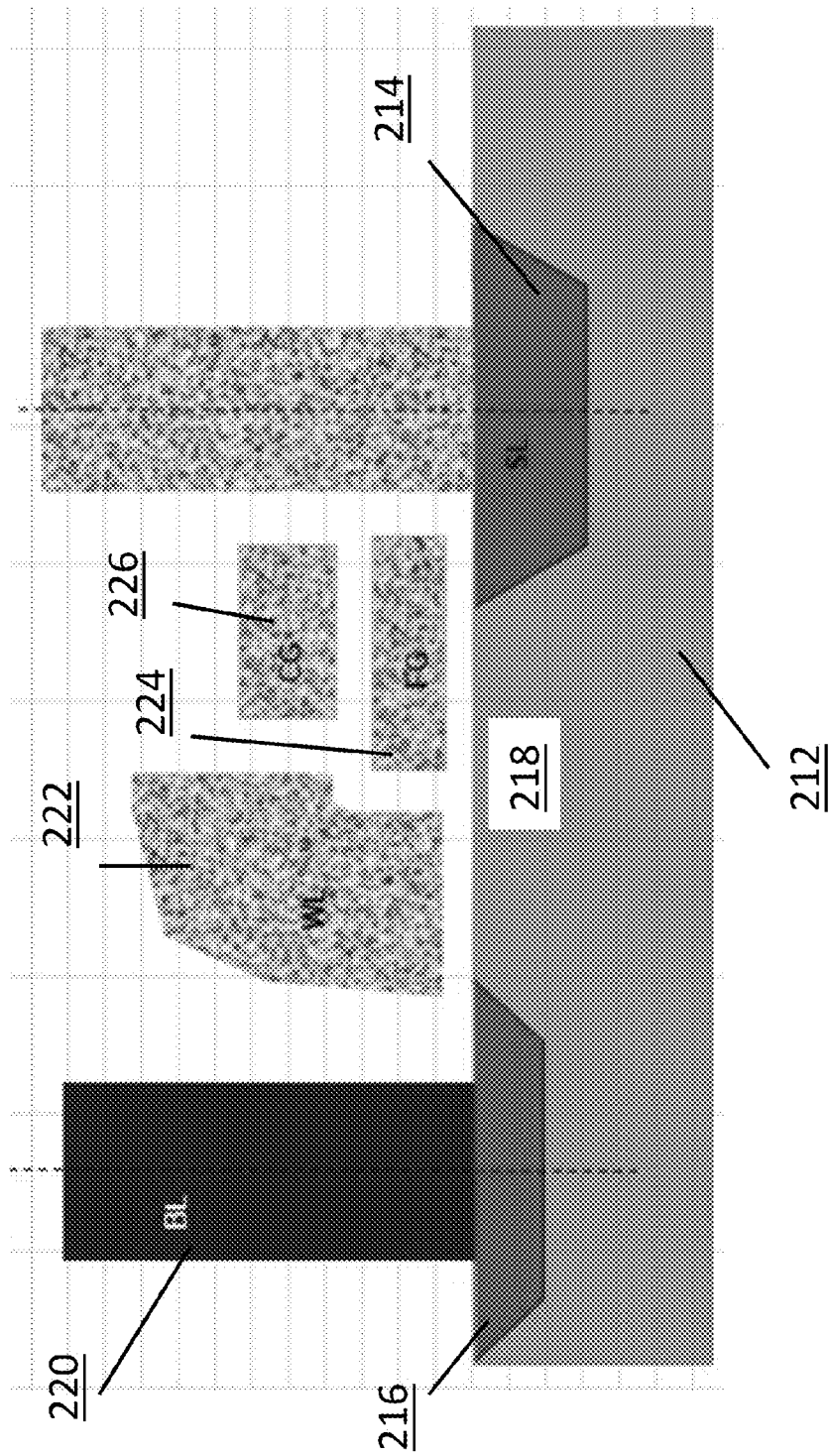
FIG. 2 is a cross-sectional view of a non-volatile memory cell of the prior art to which the method of the present invention can be applied.
Figure 3:
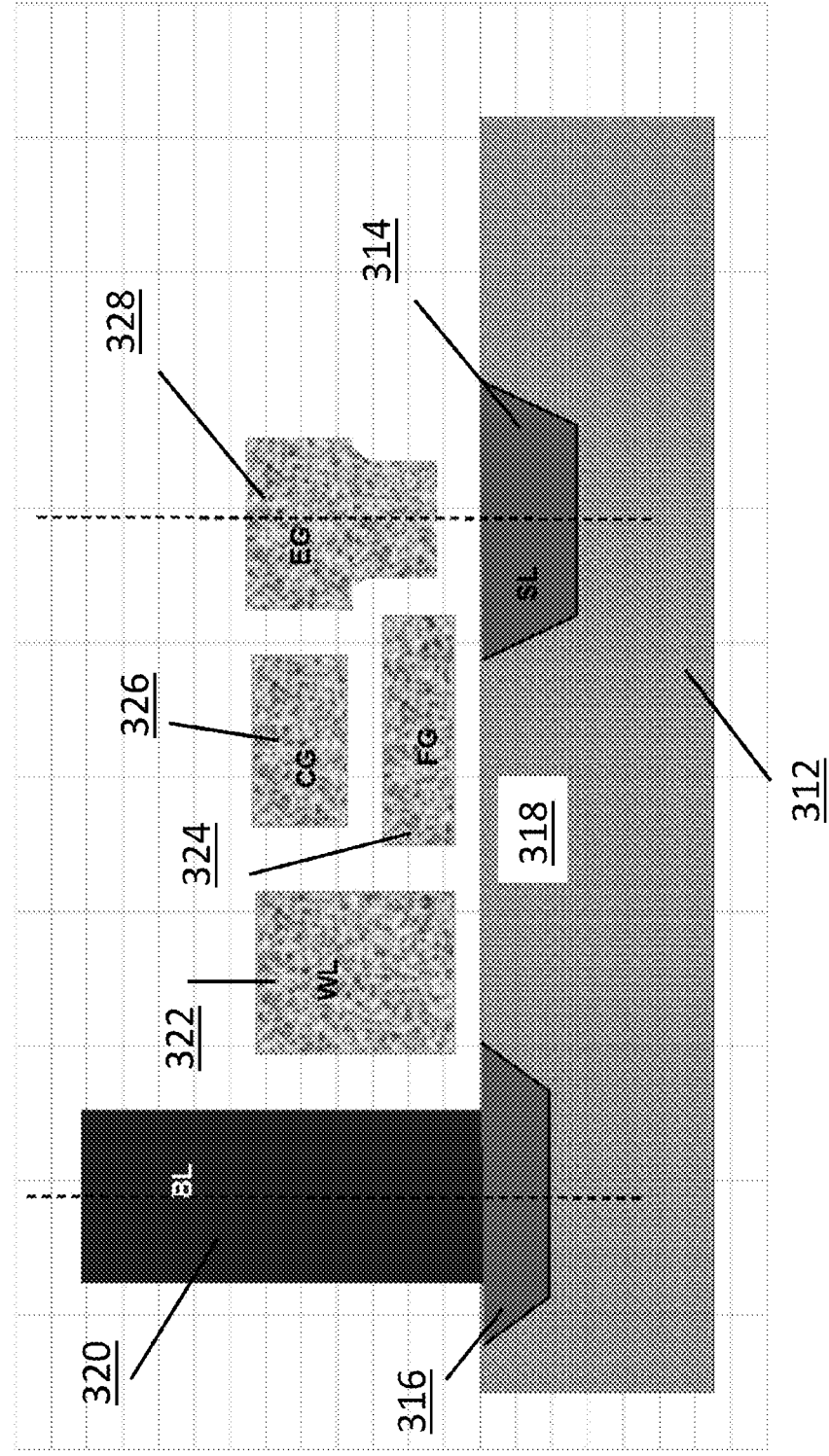
FIG. 3 is a cross-sectional view of a non-volatile memory cell of the prior art to which the method of the present invention can be applied.
Figure 4:
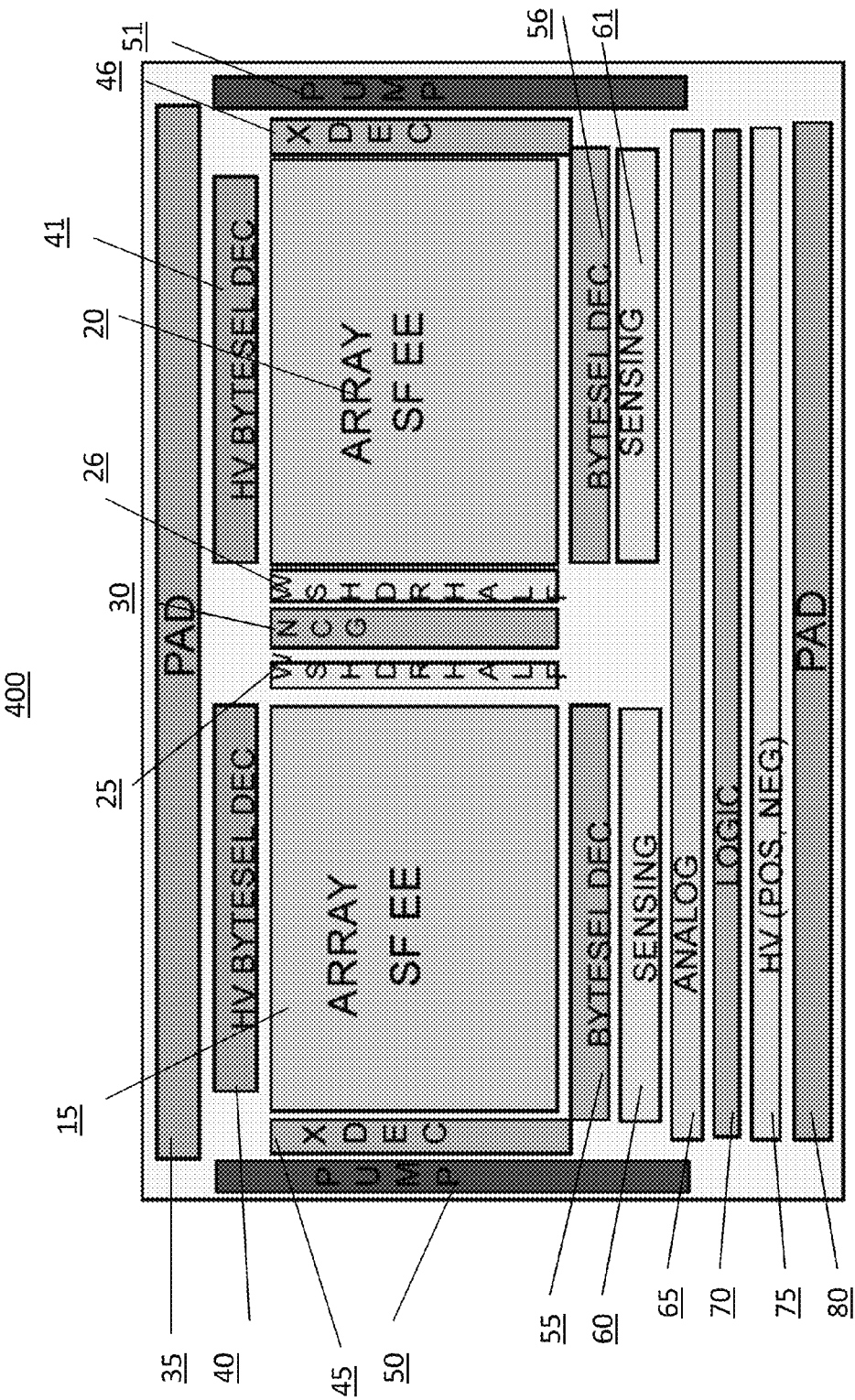
FIG. 4 is a layout diagram of a memory device comprising non-volatile memory cells of the type shown in FIGS. 1-3.

FIG. 4 depicts an embodiment of an architecture for a two-dimensional flash SFEE memory system. Die 400 comprises: memory array 15 and memory array 20 for storing data, the memory array optionally utilizing memory cell 110 as in FIG. 1, memory cell 210 as in FIG. 2, or memory cell 310 as in FIG. 3, pad 35 and pad 80 for enabling electrical communication between the other components of die 400 and, typically, wire bonds (not shown) that in turn connect to pins (not shown) or package bumps that are used to access the integrated circuit from outside of the packaged chip or macro interface pins (not shown) for interconnecting to other macros on a SOC (system on chip); high voltage circuit 75 used to provide positive and negative voltage supplies for the system; control logic 70 for providing various control functions, such as redundancy and built-in self-testing; analog circuit 65; sensing circuits 60 and 61 used to read data from memory array 15 and memory array 20, respectively; row decoder circuit 45 and row decoder circuit 46 used to access the row in memory array 15 and memory array 20, respectively, to be read from or written to; byte select decoder 55 and byte select decoder 56 used to access bytes in memory array 15 and memory array 20, respectively, to be read from or written to; charge pump circuit 50 and charge pump circuit 51, used to provide increased voltages for program and erase operations for memory array 15 and memory array 20, respectively; high voltage driver circuit 30 shared by memory array 15 and memory array 20 for read and write (erase/program) operations; high voltage driver circuit 25 used by memory array 15 during read and write operations and high voltage driver circuit 26 used by memory array 20 during read and write (erase/program) operations; and high voltage byte select decoder 40 and high voltage byte select decoder 41 used to select or un-select bitlines that are to be programmed during a write operation for memory array 15 and memory array 20, respectively. As discussed in greater detail below, memory array 15 and memory array 20 are accessed in a manner that emulates traditional EEPROM functionality.

Figure 5:
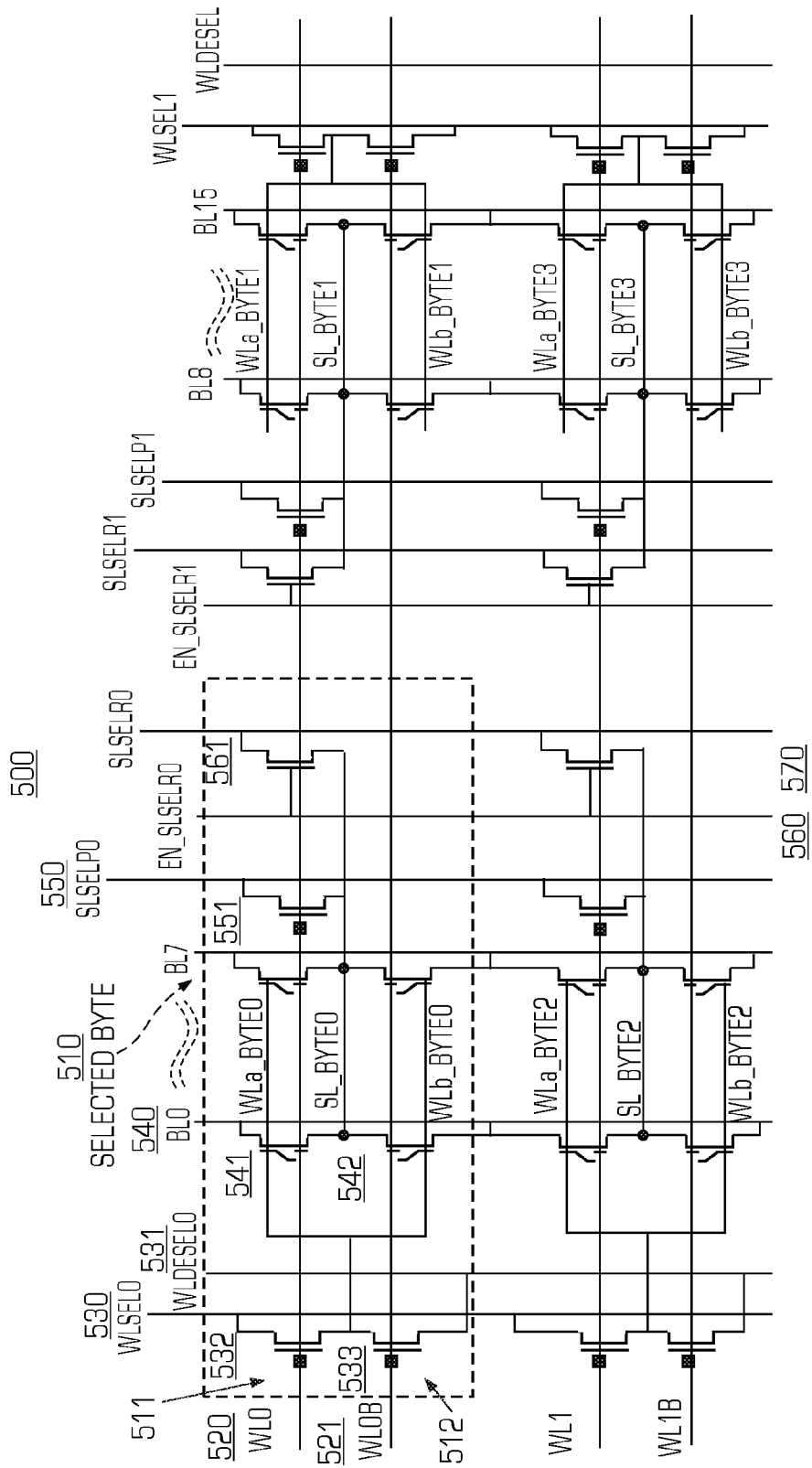
FIG. 5 depicts an embodiment of a flash memory circuit.

With reference to FIG. 5, an embodiment of a flash memory circuit 500 with EEPROM functionality is depicted (Disturb Free Super Flash EEPROM). In this embodiment, flash memory circuit 500 is used with flash memory cells of the type shown in FIG. 1. Description will be made of the operation of selected byte pair 510. Selected byte pair 510 comprises two selected bytes of data—a first byte 511 corresponding to a first word line (WL0) and eight bit lines (BL0 to BL7) and a second byte 512 corresponding to a second word line (WL0B) and eight bit lines (BL) to BL7). It is to be understood that connections and circuitry similar to what is described below for selected byte pair 510 and first byte 511 and second byte 512 exist for all other bytes and byte pairs in flash memory circuit 500.

Flash memory circuit 500 comprises a plurality of word lines, such as word line 520 (also labeled WL0), a plurality of associated word lines, such as word line 521 (also labeled WL0B), and a plurality of bit lines, such as bit line 540 (also labeled BL0). In prior art designs, memory cells connected to a word line and its associated word line would share a source line, meaning other unselected memory cells in a selected source line are disturbed in programming operation.

Flash memory circuit 500 also comprises word line select line 530 (also labeled WLSEL0) coupled to transistor 532 and transistor 533, word line deselect line 531 (also labeled WLDESEL0), source line select program line 550 (also labeled SLSELP0) coupled to transistor 551, enable source line select read line 560 (also labeled EN_SLSELR0) coupled to transistor 561, and source line select read line 570 (also labeled SLSELR0). In this example, bit line 540 is coupled to memory cell 541 (which, in this example, is of the type of memory cell depicted in FIG. 1). The transistors 532, 533 are high voltage (HV) transistors, e.g., gate oxide 180-220 A (Angstrom), to be able to supply erase word line voltage, e.g., 10-15V. The transistor 551 is a high voltage (HV) transistors, e.g., gate oxide 180-220 A, or medium high voltage transistors, e.g., gate oxide 100-150 A, to be able to supply programming source line voltage, e.g., 10-15V. The transistor 561 is an IO transistor type, e.g, gate oxide 80 A, to be able to sustain programming source line voltage on its drain. One embodiment uses a FG transistor for the transistor 561. Advantage of this approach includes process compatibility for FG transistor and transistor 561 in the memory array region.

Unlike in the prior art, selected byte pair 510 can be erased without any other byte or byte pair in memory circuit 500 being erased, and selected byte pair 510 can be programmed without any other byte or byte pair in memory circuit 500 being programmed. Thus, EEPROM functionality is achieved using flash memory cells. By contrast, in the prior art, the bytes corresponding to bit lines BL8 to BL15 and words line WL0 and WL0B also would have been programmed at the same type as selected byte pair 510.

Specifically, unlike in the prior art, each word line does not connect directly to each memory cell in its row and corresponding row. For example, word line 520 (WL0) is connected to the gate of NMOS transistor 532, and the source of NMOS transistor is connected to word line select line 530 (WLSEL0) and the drain of NMOS transistor is connected to word lines of memory cell 541 and memory cell 542. Thus, word line 520 only connects to word lines of memory cell 541 and memory cell 542 when word line select line 530 (WLSEL0) is asserted. If selected byte pair 510 is not intended to be selected, then world line deselect line 531 can be used to pull the voltage of the word line terminals on the memory cells in selected byte pair 510 to 0V or a negative voltage. In this manner, a word line can access just one byte pair of memory cells instead of all memory cells in a row and associated row.

Similarly, each source line does not connect directly to each memory cell in its row. For example, SLBYTE0 is connected only to memory cell 541 and memory cell 542 and other memory cells in selected byte pair 510 and not to other memory cells outside of selected byte pair 510. In this manner, a source line can access just one byte pair of memory cells instead of all memory cells in a row and corresponding row.

An exemplary sets of parameters used to perform erase, program and read operations is shown in Tables 8A-8D below:

TABLE 8A

| | Selected Byte | | |
|---|---|---|---|
| | WL selected | WLB selected | WL un-selected | WLB unselected |
| ERASE | VWL-E | 0V/VWLB-Ebias | VWL_Ebias/0V | 0V/Vdd |
| PROGRAM | VWL-P | 0V/VWLB-Pbias | 0V/VWL-Pbias | Vdd/0V |
| READ | VWL-R | 0V | 0V | Vdd |

TABLE 8B

| | WLSEL selected | WLSEL un-selected | SLSELP selected | SLSELP un-selected |
|---|---|---|---|---|
| ERASE | VWLSEL_E | 0V(*) | 0V | 0V(*) |
| PROGRAM | VWLSEL_P | 0V(*) | VSLSELP_P | 0V(*) |
| READ | VWLSEL_R | 0V | 0V | 0V |

TABLE 8C

| | EN_SLSELR selected | SLSELR selected | EN_SLSELR un-selected | SLSELR un-selected |
|---|---|---|---|---|
| ERASE | Vdd | 0V | Vdd | 0V(*) |
| PROGRAM | VSLSELR-Pbias | VSLSELR-Pbias | Vdd | 0V(*) |
| READ | Vdd | 0V | Vdd | 0V |

TABLE 8D

| | Selected Byte | | |
|---|---|---|---|
| | BL selected | BL un-selected | BL others un-selected |
| ERASE | 0V | 0V | 0V(*) |
| PROGRAM | IPROG | VINH | 0V(*) |
| READ | VBLR | 0V | 0V |

0 V(*) = 0 V or an appropriate bias can be applied to reduce oxide stress
Erase:
VWL-E: ~12-13 V
VWL_Ebias: ~1-3 V
VWLB_Ebias: ~1-3 V
VWLSEL_E: ~10-12 V
WLDESELx = GND/VWLB-Ebias
Read:
VWLSEL_R: ~2.5 V
VBLR: ~0.8-2 V
VWL-R: ~3-4 V
WLDESELx 0 V
Program:
VWL-P: ~12-13 V
VWL-Pbias: ~1-3 V
VWLB-Pbias: ~1-3 V
VWLSEL_P: ~1-2 V TABLE 8D-continued

| | Selected Byte | | |
|---|---|---|---|
| | BL selected | BL un-selected | BL others un-selected |

Figure 6:
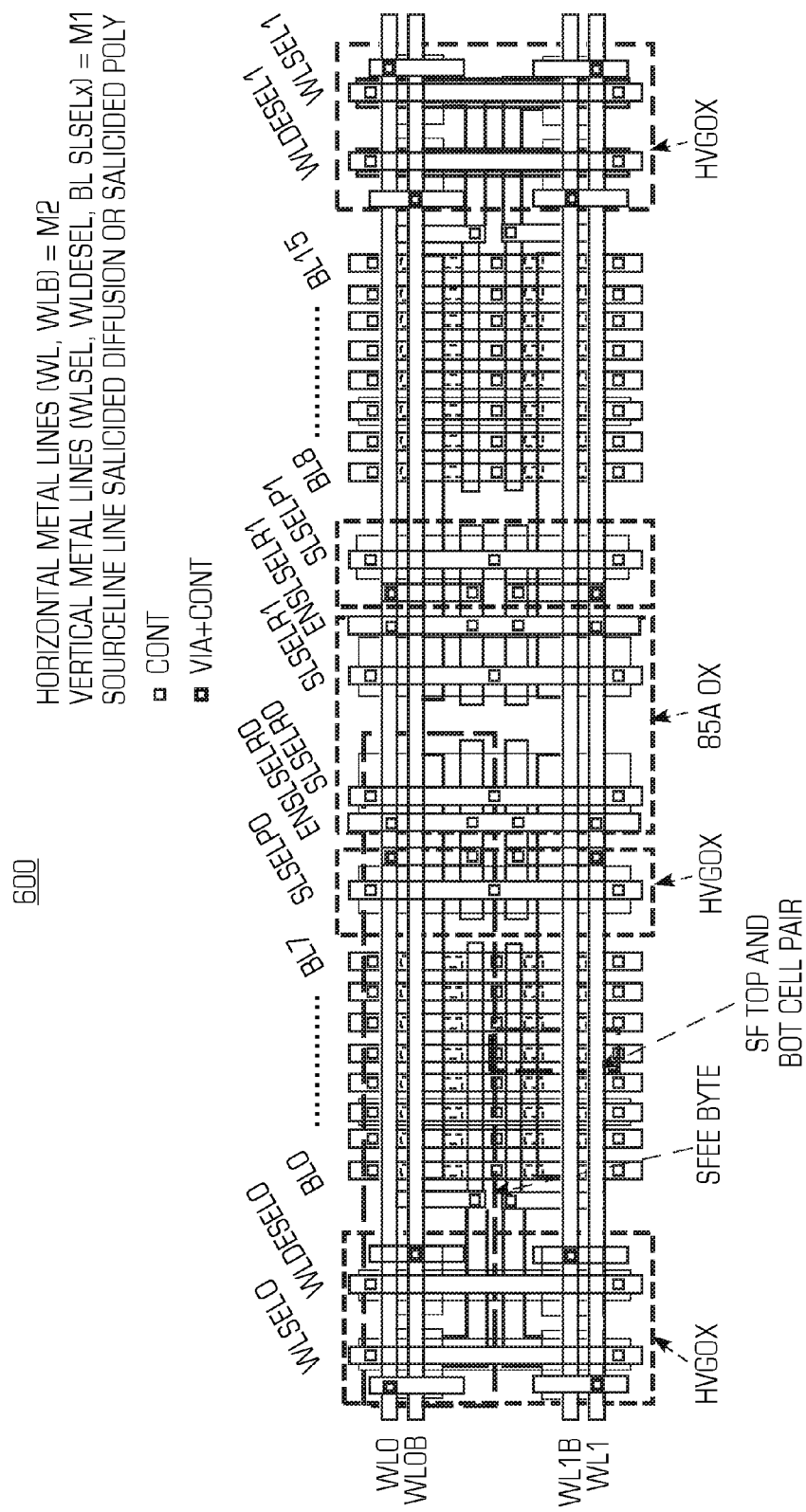
FIG. 6 is a layout diagram of an embodiment of a flash memory circuit.

VSLSELP-P: ~9-10 V
VSLSELR-Pbias: ~2-3 V
IPROG: ~0.1-3 uA
VINH: ~Vdd V
WLDESELx = GND/VWLB-Pbias With reference to FIG. 6, an embodiment of a physical layout 600 of the design shown in FIG. 5 is depicted. Word lines (WLx) are done horizontally in metal 2 layer and select and de-select lines (WLSELx, WLDESELx, SLSELx, ENSLSELx) are done vertically in metal 1 layer. Source lines are done in salicided diffusion or silicided poly.

Figure 7:
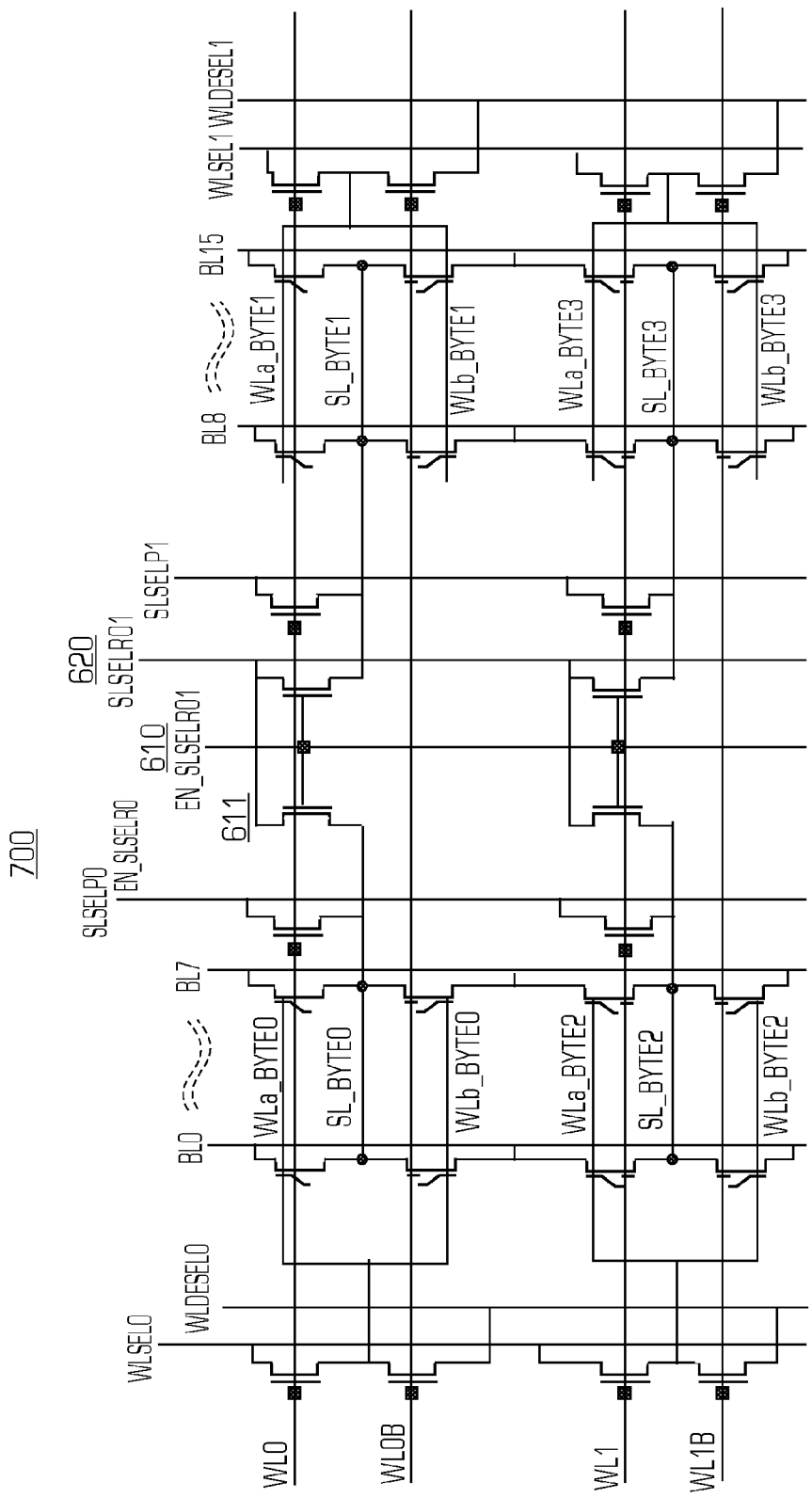
FIG. 7 depicts an embodiment of a flash memory circuit.

With reference to FIG. 7, an embodiment of flash memory circuit 700 that contains modifications to the flash memory circuit 500 of FIG. 5 is depicted. Many structures in FIG. 7 are identical to those of FIG. 5 and will not be described again. The modifications comprise a shared enable source line select read line 610 (also labeled EN_SLSELR01) coupled to transistor pair 611, and source line select read line 620 (also labeled SLSELR01) that are used to select for reading two byte pairs instead of one byte pair. Here, the two byte pairs correspond to bit lines BL0 . . . BL7 and BL8 . . . BL15 and word lines WL0 and WL0B. The shared enable source line select read line 610 and source line select read line 620 can be used to read both byte pairs.

Figure 8:
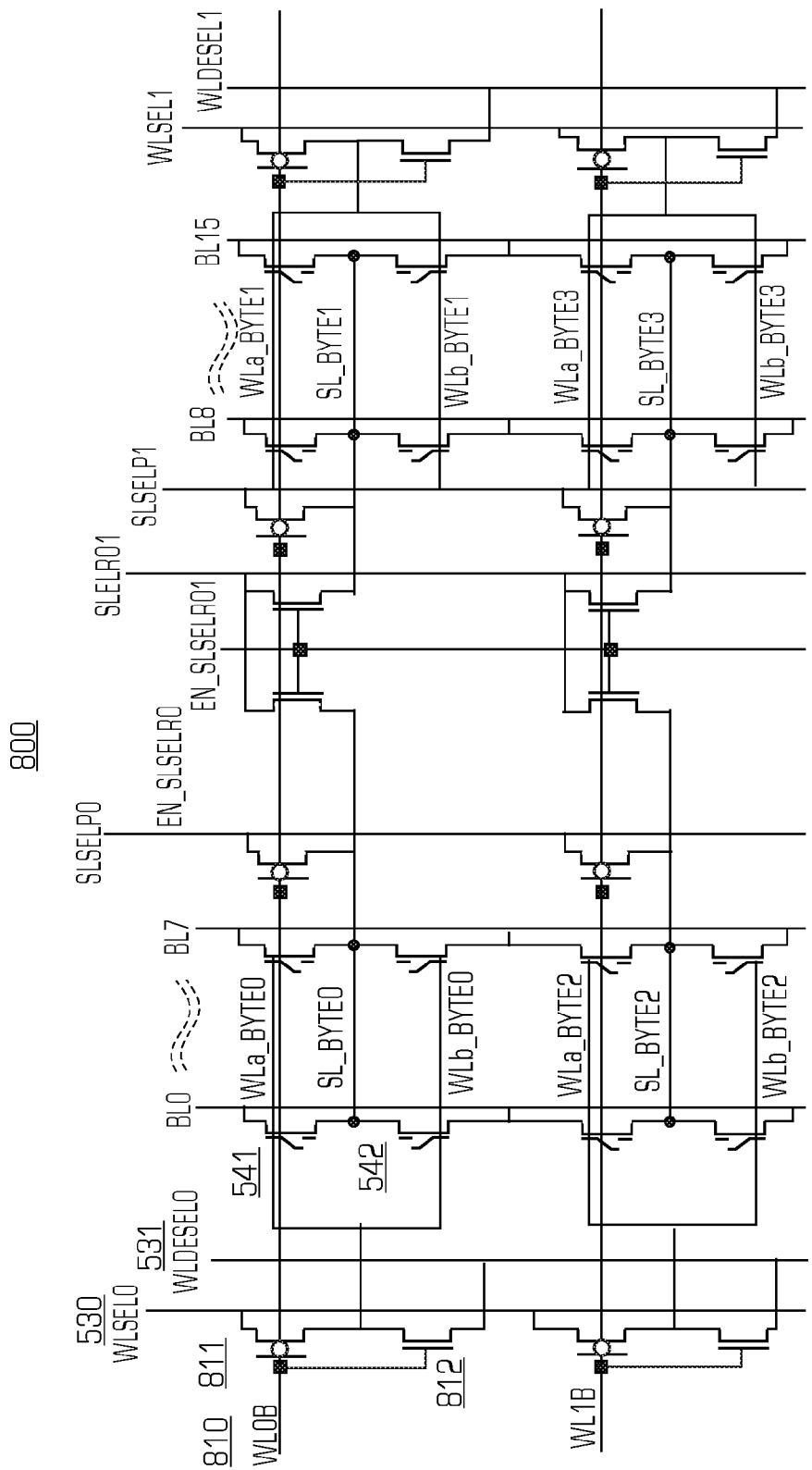
FIG. 8 depicts an embodiment of a flash memory circuit.

With reference to FIG. 8, an embodiment of flash memory circuit 800 that contains modifications to the flash memory circuit 700 of FIG. 7 is depicted. Many structures in FIG. 8 are identical to those of FIG. 7 and will not be described again. The modifications comprise the use of a single word line for two rows of memory cells instead of two word lines. For example, the first two rows are accessed with word line bar line 810 (also labeled WL0B), instead of two words lines as in FIGS. 5-6. The plurality of word lines are coupled to the gates of a HV (high voltage) PMOS transistor and an HV NMOS transistor. For example, word line 810 is coupled to PMOS transistor 811 and NMOS transistor 812. In this manner, the same functions in FIG. 7 that are performed by a word line and its word bar line are performed by only a word bar line. One of skill in the art will appreciate that instead of word bar lines, word lines instead could be used, with the placement of PMOS and NMOS transistors being swapped.

Figure 9:
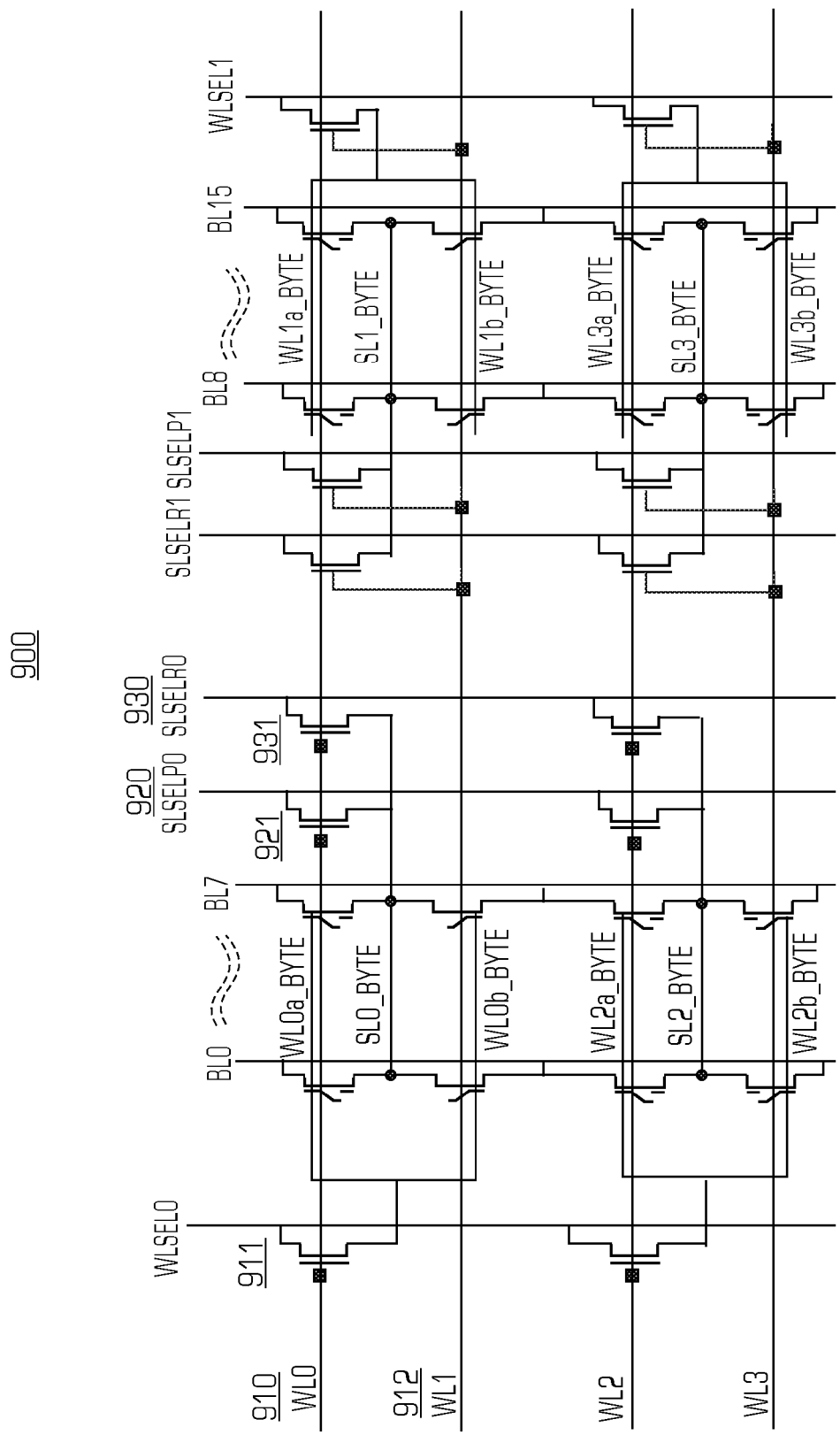
FIG. 9 depicts an embodiment of a flash memory circuit.

With reference to FIG. 9, an embodiment of flash memory circuit 900 that contains modifications to the flash memory circuit 500 of FIG. 5 is depicted. Many structures in FIG. 8 are identical to those of FIG. 5 and will not be described again. The modifications comprise the use of one word line and one NMOS transistor for selecting every two internal rows of memory cells, such as word line 910 (also labeled WL0) and transistor 911 for two rows. The plurality of lines are coupled to the gate of an NMOS transistor 911. For example, word line 910 is coupled to NMOS transistor 911 as shown. The word line 910 (associated with operating on byte with BL0-7) is coupled to transistor 921 and transistor 931. Source line program select line SLSELP0 920 is connected to the transistor 921. Source line read select line SLSELR0 920 is connected to the transistor 931. Word line 912 WL1 functions similarly to the word line WL0 910 for byte with bitlines BL8-15. In this manner, the same functions in FIG. 5 that are performed by two word lines 520 and 521 and two transistors 532 and 533 are performed by only one word line 910 and one transistor 911. In flash memory circuit 900, the word line deselect line 531 (also labeled WLDESEL0 in FIG. 5) and enable source line select read line 560 (also labeled EN_SLSELR1 in FIG. 5) are not required. Word line WL1 912 is for selecting next adjacent byte horizontally (with BL8-15). In one embodiment, it can be implemented to be the same line as word line 910. One bias operation embodiment requires all internal wordlines of memory cells pre-charged to ground before any operation.

Figure 10:
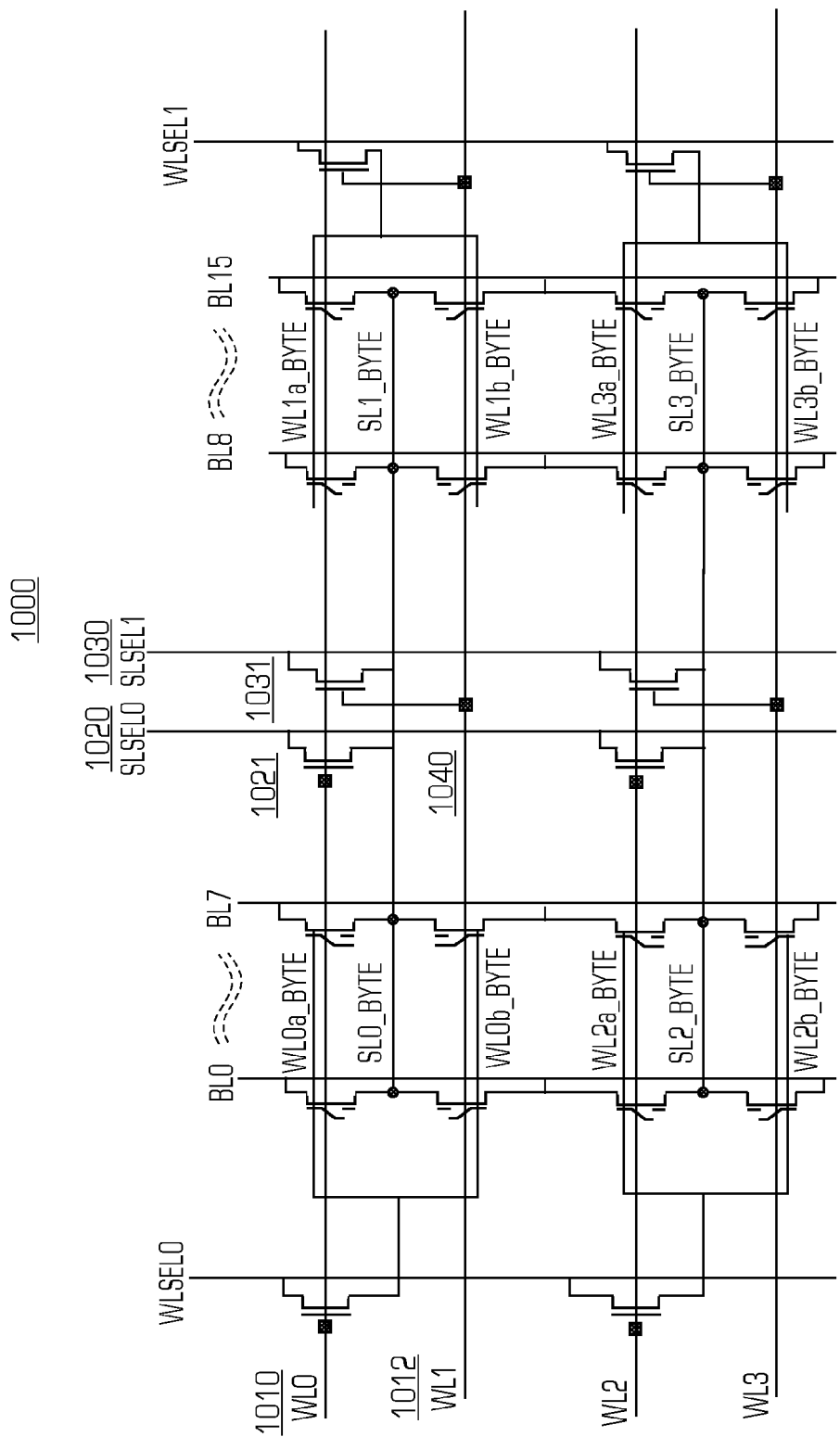
FIG. 10 depicts an embodiment of a flash memory circuit.

With reference to FIG. 10, an embodiment of flash memory circuit 1000 that contains modifications to the flash memory circuit 900 of FIG. 9 is depicted. Many structures in FIG. 10 are identical to those of FIG. 9 and will not be described again. The modifications comprise the use of a shared memory cell source line 1040 shared between two byes (with BL0-7 and BL8-15). It also comprises a source line select line 1010 (also labeled SLSEL0) coupled to transistor 1011 and a source line select line 1020 (also labeled SLSEL1) coupled to transistor 1021 used to select two byte pairs instead of one byte pair for programming and reading, respectively. Here, the two byte pairs correspond to bit lines BL0 . . . BL7 and BL8 . . . BL15. The source line select line 1010 and source line select line 1020 can be used to program and read.

Figure 11:
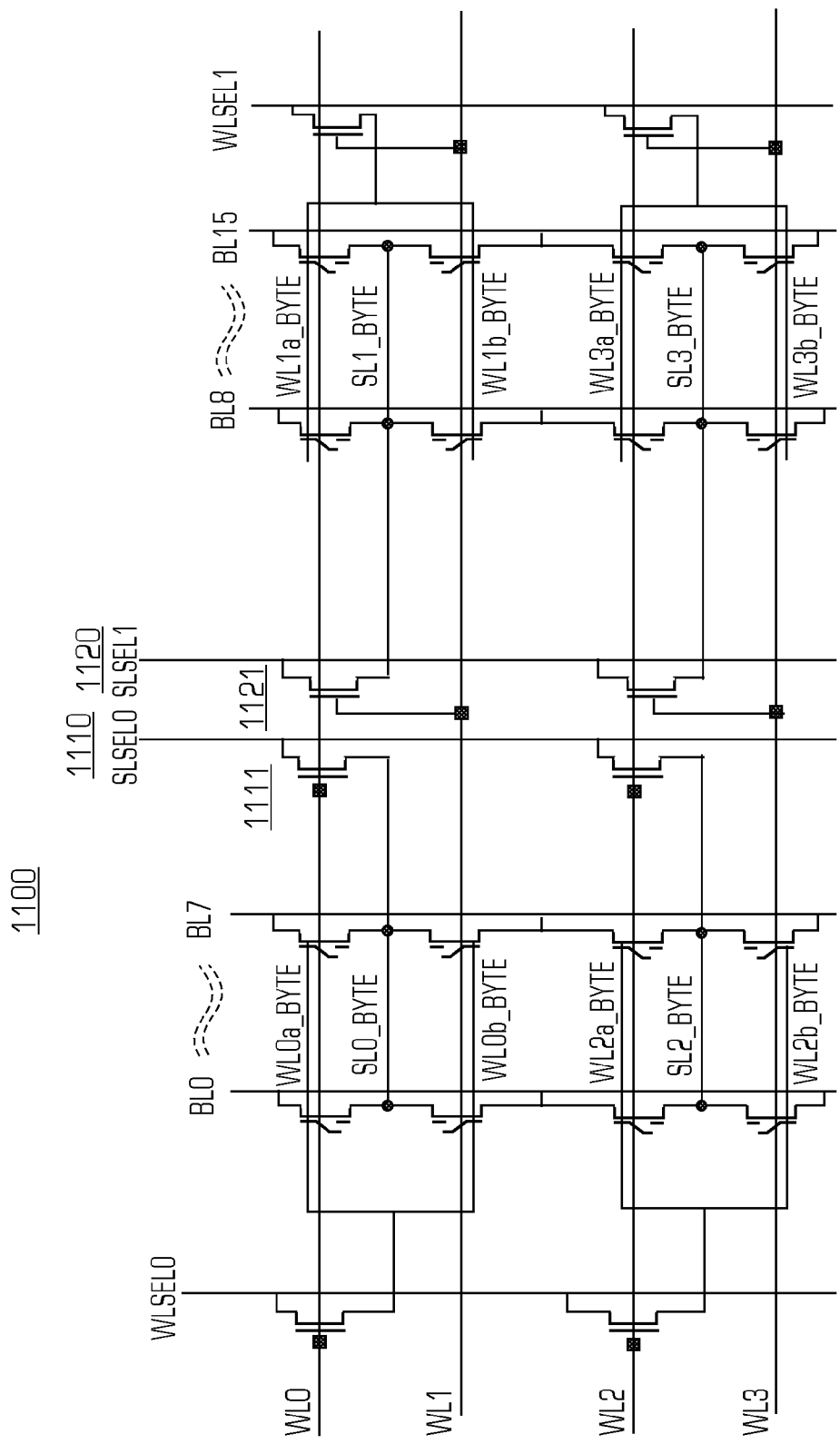
FIG. 11 depicts an embodiment of a flash memory circuit.

With reference to FIG. 11, an embodiment of flash memory circuit 1100 that contains modifications to the flash memory circuit of FIG. 10 is depicted. Many structures in FIG. 11 are identical to those of FIG. 10 and will not be described again. The modifications comprise the use of source line select line 1110 coupled to NMOS transistor 1111 and source line select line 1120 coupled to NMOS transistor 1121. The source line select line 1110 is used to program and read selected byte pair 510, and source line select line 1120 is used to program and read the byte pair corresponding to bit lines BL8 to BL15 and word lines WL0 and WL1. Thus, each byte pair can be independently programmed. The source line select line 1110 and the NMOS transistor 1111 are shared for program and read selection.

Figure 12:
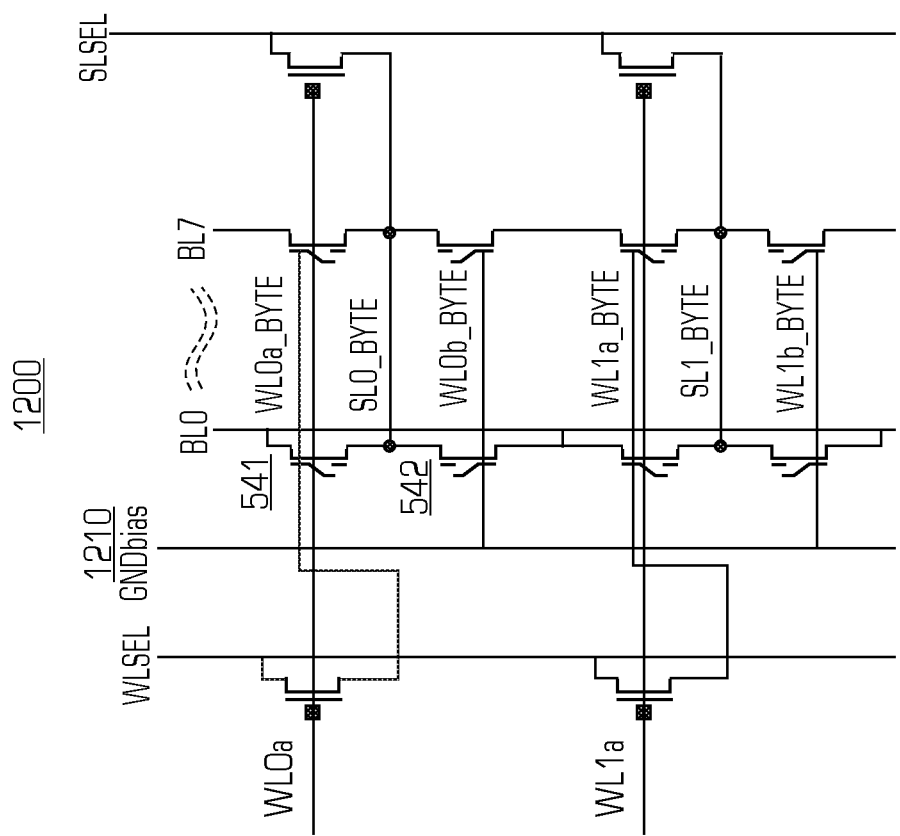
FIG. 12 depicts an embodiment of a flash memory circuit.

With reference to FIG. 12, an embodiment of flash memory circuit 1200 that contains modifications to the flash memory circuit of previous figures is depicted. Many structures in FIG. 12 are identical to those of previous figures and will not be described again. Half of the rows of memory cells are not used in flash memory circuit 1200. For example, the row containing memory cell 542 is not used, and the word lines for those memory cells are connected to ground bias 1210. However, the other half of the memory rows, such as the one containing memory cell 541, is used as described in previous figures.

Figure 13:
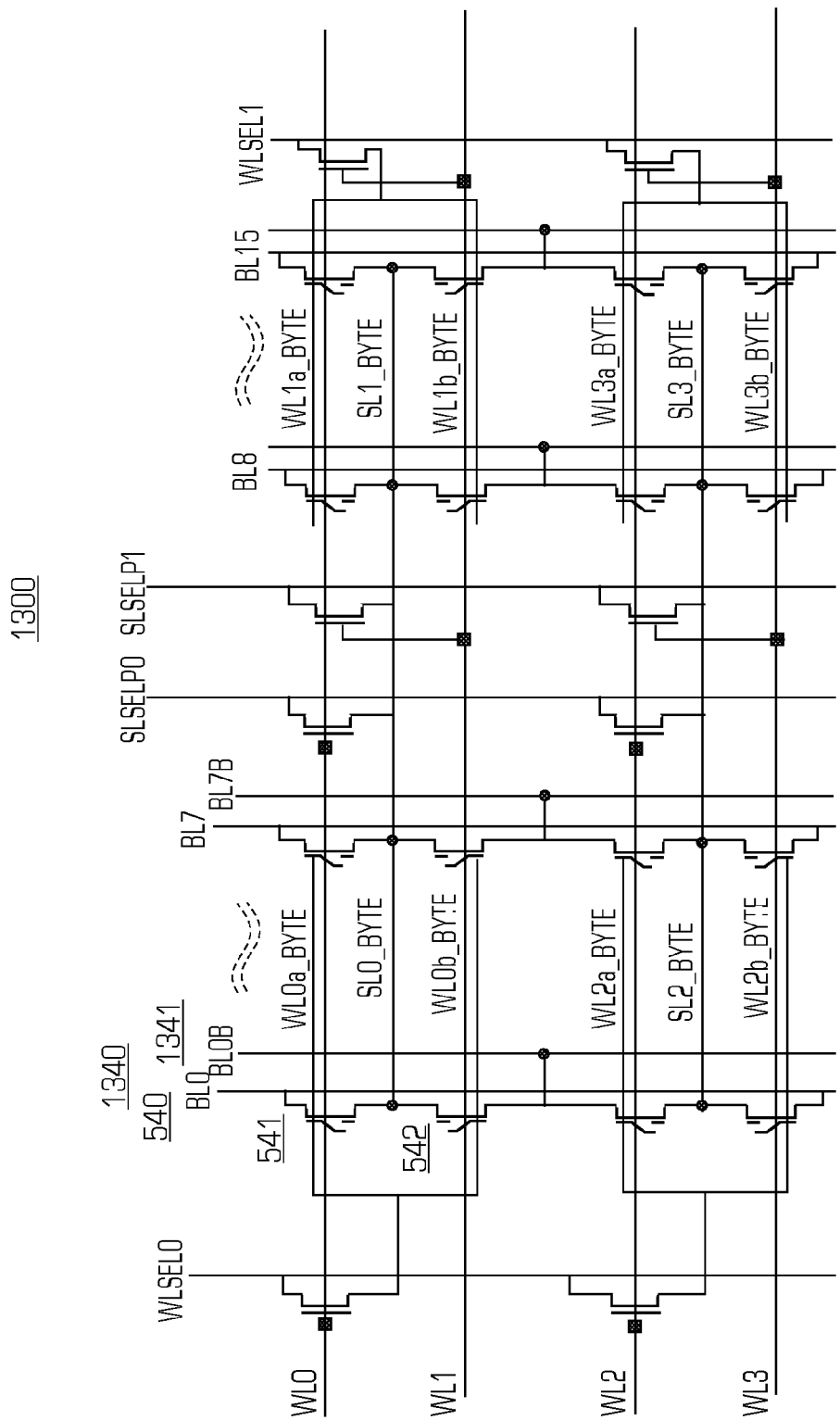
FIG. 13 depicts an embodiment of a flash memory circuit.

With reference to FIG. 13, an embodiment of flash memory circuit 1300 that contains modifications to the flash memory circuit of previous figures is depicted. Many structures in FIG. 13 are identical to those of previous figures and will not be described again. In flash memory circuit 1300, each column of memory cells is coupled to two bit lines instead of just one. For example, the column containing memory cell 541 and memory cell 542 (to be called a unit cell pair) is coupled to bit line pair 1340 comprising bit line 540 (bitline BL0) and bit line 1341 (bitline bar BL0B or called complementary bitline). A similar bit line pair exists for each column of memory cells. In the specific example of memory cell 541 and memory cell 542, bit line 540 is coupled to memory cell 541 and bit line 1341 is coupled to memory cell 542. Memory cell 542 (and other memory cells similarly situated in a pair or memory cells) is not actually used to store data. During a read operation, bit line 1341 will be connected to ground, and memory cell 542 will act as a pull-down transistor to bring the source line (SL0_BYTE) down to a low voltage. Thus, half of the rows of the memory array are not used to store data but are used for pull-downing the sourceline to a low voltage (i.e., ground decoding). The above embodiment of bitline and complementary bitline for a unit cell pair is applicable to the following embodiments associated with cell type two in FIG. 3 and cell type three in FIG. 4.

Figure 14:
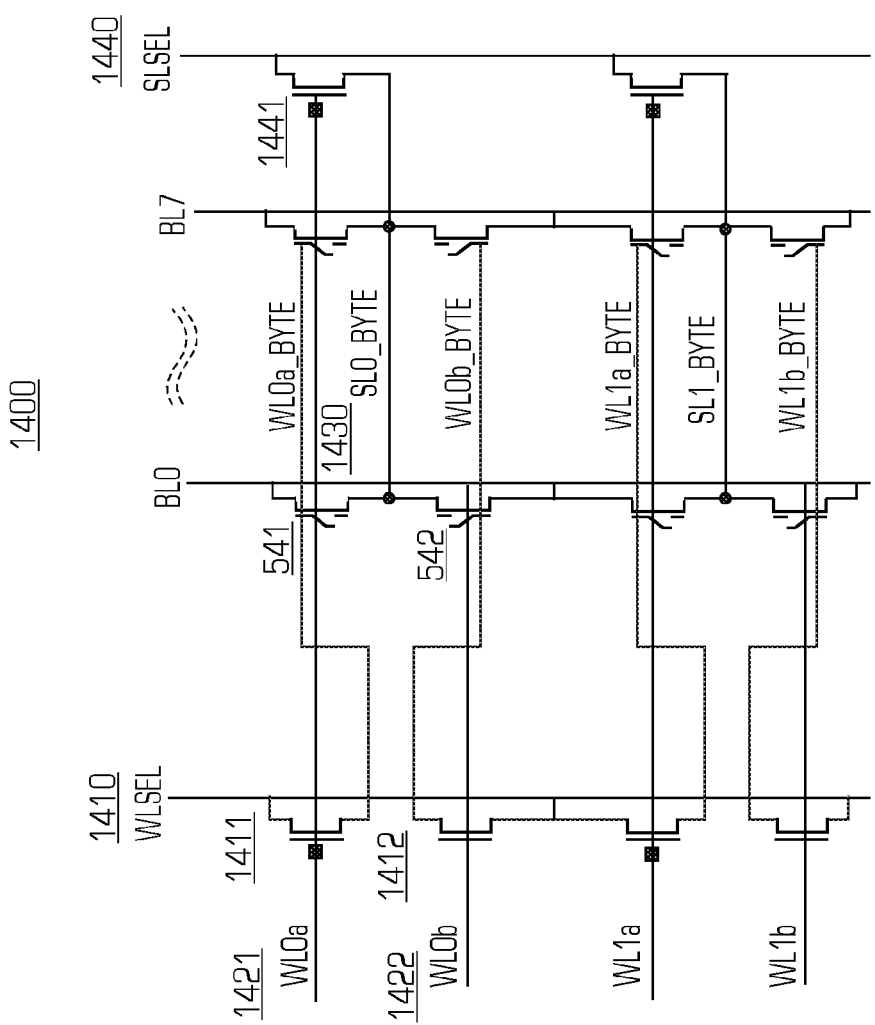
FIG. 14 depicts an embodiment of a flash memory circuit.

With reference to FIG. 14, an embodiment of flash memory circuit 1400 that contains modifications to the flash memory circuit of previous figures is depicted. Many structures in FIG. 14 are identical to those of previous figures and will not be described again. Word line select line 1410 (WLSEL) is coupled to NMOS transistor 1411 and NMOS transistor 1412. The gate of NMOS transistor 1411 is controlled by word line 1421 (WL0a) and the gate of NMOS transistor 1412 is controlled by word line 1422 (WL0b), with one terminal of NMOS transistor 1411 and one terminal of NMOS transistor 1412 connected to word line select line 1410 (WLSEL) as shown. Each word line can select a row of memory cells. The memory cells share the source lines in pairs of rows as shown. For example, memory cell 541 and memory cell 542 share source line 1430 (SL0_BYTE). Source line select line 1440 is coupled to NMOS transistor 1441, which in turn is coupled to the memory cell source line 1430. In this embodiment, individual bytes can be read, erased, and programmed with one transistor and one word line select line for selecting a row of memory cells of a byte.

Figure 15:
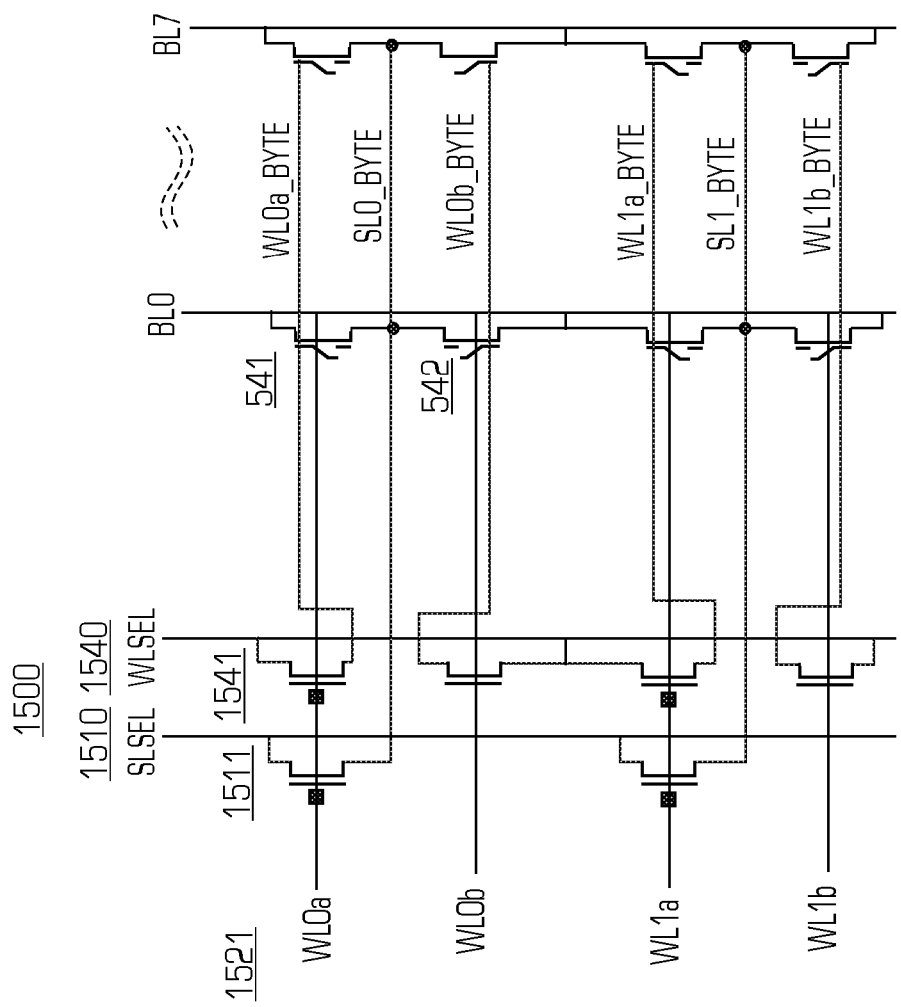
FIG. 15 depicts an embodiment of a flash memory circuit.

With reference to FIG. 15, an embodiment of flash memory circuit 1500 that contains modifications to the flash memory circuit of previous figures is depicted. Many structures in FIG. 15 are identical to those of previous figures and will not be described again. In this embodiment, word line select line and transistor and source line select line and transistor are laid out on the same side of the memory byte. Flash memory circuit 1500 otherwise operates in the same manner as flash memory circuit 1400 in FIG. 14.

In an alternative embodiment of flash memory circuits 500, 700, 800, 900, 1000, 1100, 1200, 1300, and 1400, half of the rows (such as all odd rows or all even rows, or some combination of the two) can have its bitline terminal (e.g., bitline contact) removes, its floating gate removed, or its word line terminal tied to ground, such that those rows are not used to store data.

In another alternative embodiment of flash memory circuits 500, 700, 800, 900, 1000, 1100, 1200, 1300, and 1400, the number of cells (bits) within a byte (i.e., 8 cells) that are the subject of a read or program operation can be configurable. In one embodiment a read operation is sequentially done 1 or 2 or 4 cells (bits) at a time until all cells in a byte is completed. In one embodiment a program operation is sequentially done 1 or 2 or 4 cells (bits) at a time until all cells in a byte is completed.

In an alternative embodiment of flash memory circuits 500, 700, 800, 900, 1000, 1100, 1200, 1300, and 1400, the transistors connected to the source line select lines (such as transistor 551 connected to source line select program line 550) is a native transistor (i.e., meaning its threshold voltage is close to zero volts).

In an alternative embodiment of flash memory circuits 500, 700, 800, 900, 1000, 1100, 1200, 1300, and 1400, the transistors connected to the source line select read lines (such as transistor 561 connected to source line select read line 570) is an HV OX (high voltage oxide) transistor.

In an alternative embodiment of flash memory circuits 500, 700, 800, 900, 1000, 1100, 1200, 1300, and 1400, the transistors connected to the source line select read lines (such as transistor 561 connected to source line select read line 570) can be removed, and the transistors connected to the source line select program lines (such as transistor 551 connected to source line select program line 550) is sized up to operate in read (replacing the transistor 561).

In an alternative embodiment of flash memory circuits 500, 700, 800, 900, 1000, 1100, 1200, 1300, and 1400, the transistors connected to the word line select line (such as transistor 532 connected to word line select line 530) and the transistors connected to the source line select line (such as transistor 551 connected to source line select program line 550) are PMOS transistors instead of NMOS transistors, with the control signals connected thereto being complementary signals to the ones described previously for use with NMOS transistors.

In an alternative embodiment of flash memory circuits 500, 700, 800, 900, 1000, 1100, 1200, 1300, and 1400, more than two bytes of memory cells connect to a common shared source line. In one embodiment, four bytes of memory cells connects to a common shared source line.

In an alternative embodiment of flash memory circuits 500, 700, 800, 900, 1000, 1100, 1200, 1300, and 1400, the word line and source line control signals (which can be connected through vertical metal lines, parallel to memory bitlines) are introduced through nodes that are physically located between individual memory cells or at the end of a byte of memory cells.

Figure 16:
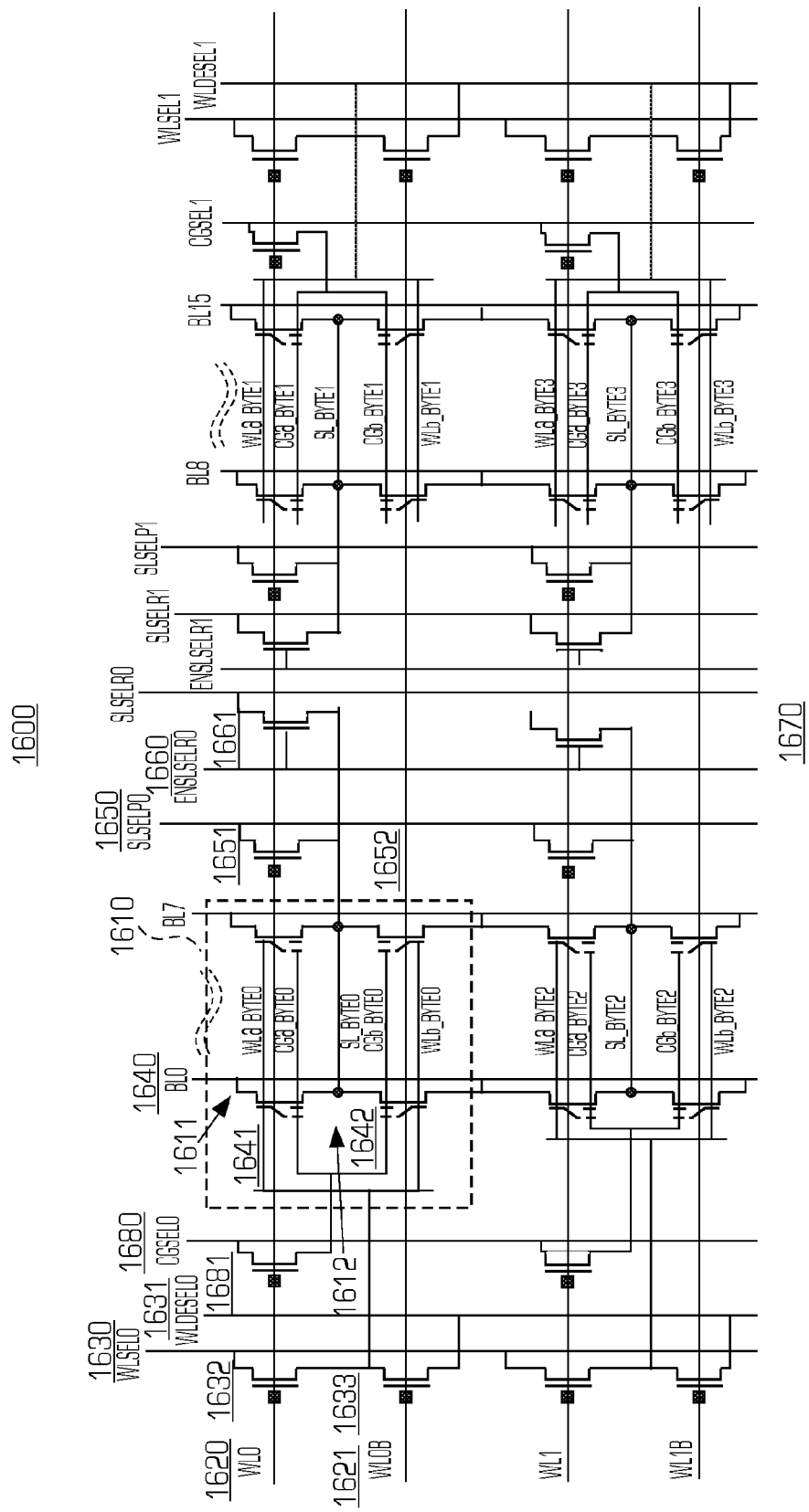
FIG. 16 depicts an embodiment of a flash memory circuit.

With reference to FIG. 16, an embodiment of a flash memory circuit 1600 with EEPROM functionality is depicted. In this embodiment, flash memory circuit 1600 is used with flash memory cells of the type shown in FIG. 2. Description will be made of the operation of selected byte pair 1610. Selected byte pair 1610 comprises two selected bytes of data—a first byte 1611 corresponding to a first word line (WL0) and eight bit lines (BL0 to BL7) and a second byte 1612 corresponding to a second word line (WL0B) and eight bit lines (BL) to BL7). It is to be understood that similar connections and circuitry exist for all other bytes and similar byte pairs in flash memory circuit 1600. Flash memory circuit 1600 comprises a plurality of word lines, such as word line 1620 (also labeled WL0), a plurality of associated word lines, such as word line 1621 (also labeled WL0B), and a plurality of bit lines, such as bit line 1640 (also labeled BL0). Word lines and associated word lines would have shared a source line in the prior art designs.

Flash memory circuit 1600 also comprises word line select line 1630 (also labeled WLSEL0) coupled to transistor 1632 and transistor 1633, word line deselect line 1631 (also labeled WLDESEL0), source line select program line 1650 (also labeled SLSELP0) coupled to transistor 1651, enable source line select read line 1660 (also labeled EN_SLSELR0) coupled to transistor 1661, and source line select read line 1670 (also labeled SLSELR0). In this example, bit line 1640 is coupled to memory cell 1641 (which, in this example, is of the type of memory cell depicted in FIG. 2). Flash memory circuit also comprises control gate select line 1680 (also labeled CGSEL0) coupled to transistor 1681.

Unlike in the prior art, selected byte pair 1610 can be erased without any other byte or byte pair in memory circuit 1600 being erased, and selected byte pair 1610 can be programmed without any other byte or byte pair in memory circuit 1600 being programmed. Thus, EEPROM functionality is achieved using flash memory cells. By contrast, in the prior art, the bytes corresponding to bit lines BL8 to BL15 and words line WL0 and WL0B also would have been programmed at the same type as selected byte pair 1610.

Specifically, unlike in the prior art, each word line does not connect directly to each memory cell in its row and corresponding row. For example, word line 1620 (WL0) is connected to the gate of NMOS transistor 1632, and the source of NMOS transistor 1632 is connected to word line select line 1630 (WLSEL0) and the drain of NMOS transistor 1632 is connected to memory cell 1641 and memory cell 1642. Thus, word line 1620 only couples to memory cell 1641 and memory cell 1642 when word line select line 1630 (WLSEL0) is asserted. Similarly, control gate select line 1680 (CGSEL0) is connected to the source of transistor 1681, and the gate of transistor 1681 is coupled to word line 1620 (WL0), with the drain of transistor 1681 connected to the control gates of the memory cells of selected byte pair 1610 (including memory cells 1641 and 1642). In this manner, a word line can access just one byte pair of memory cells instead of all memory cells in a row and corresponding row.

Similarly, each source line does not connect directly to each memory cell in its row. For example, SLBYTE0 1652 is connected only to memory cell 1641 and memory cell 1642 and other memory cells in selected byte pair 1610 and not to other memory cells outside of selected byte pair 1610. In this manner, a source line can access just one byte pair of memory cells instead of all memory cells in a row and corresponding row. The transistors 1632, 1633 are high voltage (HV) transistors, e.g., gate oxide 180-220 A (Angstrom), to be able to supply erase word line voltage, e.g., 10-15V. The transistors 1681 is a high voltage (HV) transistor, e.g., gate oxide 180-220 A (Angstrom), to be able to supply control gate line voltage, e.g., 10-15V. The transistor 1651 is a high voltage (HV) transistor, e.g., gate oxide 180-220 A, or medium high voltage transistors, e.g., gate oxide 100-150 A, to be able to supply programming source line voltage, e.g., 4-5V. The transistor 1661 is an IO transistor type, e.g, gate oxide 80 A, to be able to sustain programming source line voltage on its drain. One embodiment uses a FG transistor for the transistor 1661. An advantage of this approach includes process compatibility for FG transistor and transistor 561 in the memory array region.

A set of specific parameters used to perform erase, program and read operations is shown in Tables 9A-9D below:

TABLE 9A

| | Selected Byte | | | |
|---|---|---|---|---|
| | WL selected | WLB selected | WL un-selected | WLB unselected |
| ERASE | VWL-E | OV/VWLB-Ebias | VWL Ebias/OV | OV/Vdd |
| PROGRAM | VWL-P | OV/VWLB-Pbias | OV/VWL-Pbias | Vdd/OV |
| READ | VWL-R | OV | OV | Vdd |

TABLE 9B

|  | WLSEL selected | WLSEL un-selected | CGSEL selected | CGSEL un-selected | SLSELP selected | SLSELP un-selected |
|---|---|---|---|---|---|---|
| ERASE | VWLSEL_E | 0V(*) | 0V/VCGSEL_ENEG | 0V(*) | 0V | 0V(*) |
| PROGRAM | VWLSEL_P | 0V(*) | VCGSEL_P | 0V(*) | VSLSELP-P | 0V(*) |
| READ | VWLSEL_R | 0V | VCGSEL_R | VCGSEL_R bias | 0V | 0V |

TABLE 9C

|  | EN_SLSELR selected | SLSELR selected | EN_SLSELR un-selected | SLSELR un-selected |
|---|---|---|---|---|
| ERASE | Vdd | 0V | Vdd | 0V(*) |
| PROGRAM | VSLSELR-Pbias | VSLSELR-Pbias | Vdd | 0V(*) |
| READ | Vdd | 0V | Vdd | 0V |

TABLE 9D

|  | Selected Byte | | |
|---|---|---|---|
|  | BL selected | BL un-selected | BL others un-selected |
| ERASE | 0V | 0V | 0V(*) |
| PROGRAM | IPROG | VINH | 0V(*) |
| READ | VBLR | 0V | 0V |

ERASE
VWL-E: ~12-13 V
VWL_Ebias: ~1-3 V
VWLB_Ebias: ~1-3 V
VWLSEL_E: ~10-12 V
VCGSEL_ENEG: ~-4 to -8V V
WLDESELx = GND/VWLB-Ebias
READ
VWLSEL_R: ~2.5 V
VBLR: ~0.8-2 V
VWL-R: ~3-4 V
VCGSEL_R: ~2-4 V
VCGSEL_Rbias: ~0-4 V
WLDESELx: = 0 V
PROG
VWL-P: ~12-13 V
VWL-Pbias: ~1-3 V
VWLB-Pbias: ~1-3 V TABLE 9D-continued

|  | Selected Byte | | |
|---|---|---|---|
|  | BL selected | BL un-selected | BL others un-selected |

Figure 17:
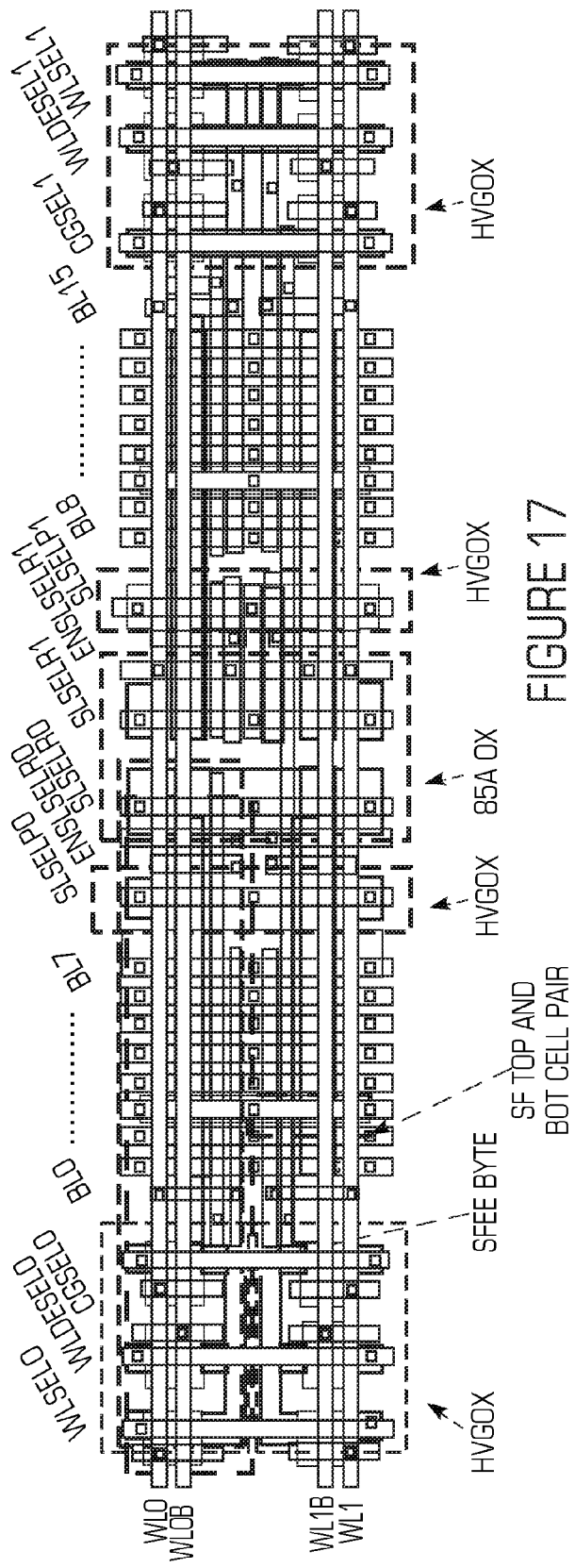
FIG. 17 is a layout diagram of an embodiment of a flash memory circuit.

VWLSEL_P: ~1-2 V
VSLSELP-P: ~4-6 V
VSLSELR-Pbias: ~2-3 V
VCGSEL-P: ~8-10 V
IPROG: ~0.1-3 uA
VINH: ~Vcid V
WLDESELx = GND/VWLB-Pbias
0V(*) = 0V or an appropriate bias can be applied to reduce oxide stress With reference to FIG. 17, an embodiment of a physical layout 1700 of the design shown in FIG. 16 is depicted. Word lines (WLx) are done horizontally in metal 2 layer and select and de-select lines (WLSELx, WLDESELx, SLSELx, ENSLSELx, CGSELx) are done vertically in metal 1 layer or metal 3 layer. Source lines are done in salicided diffusion or silicided poly.

Figure 18:
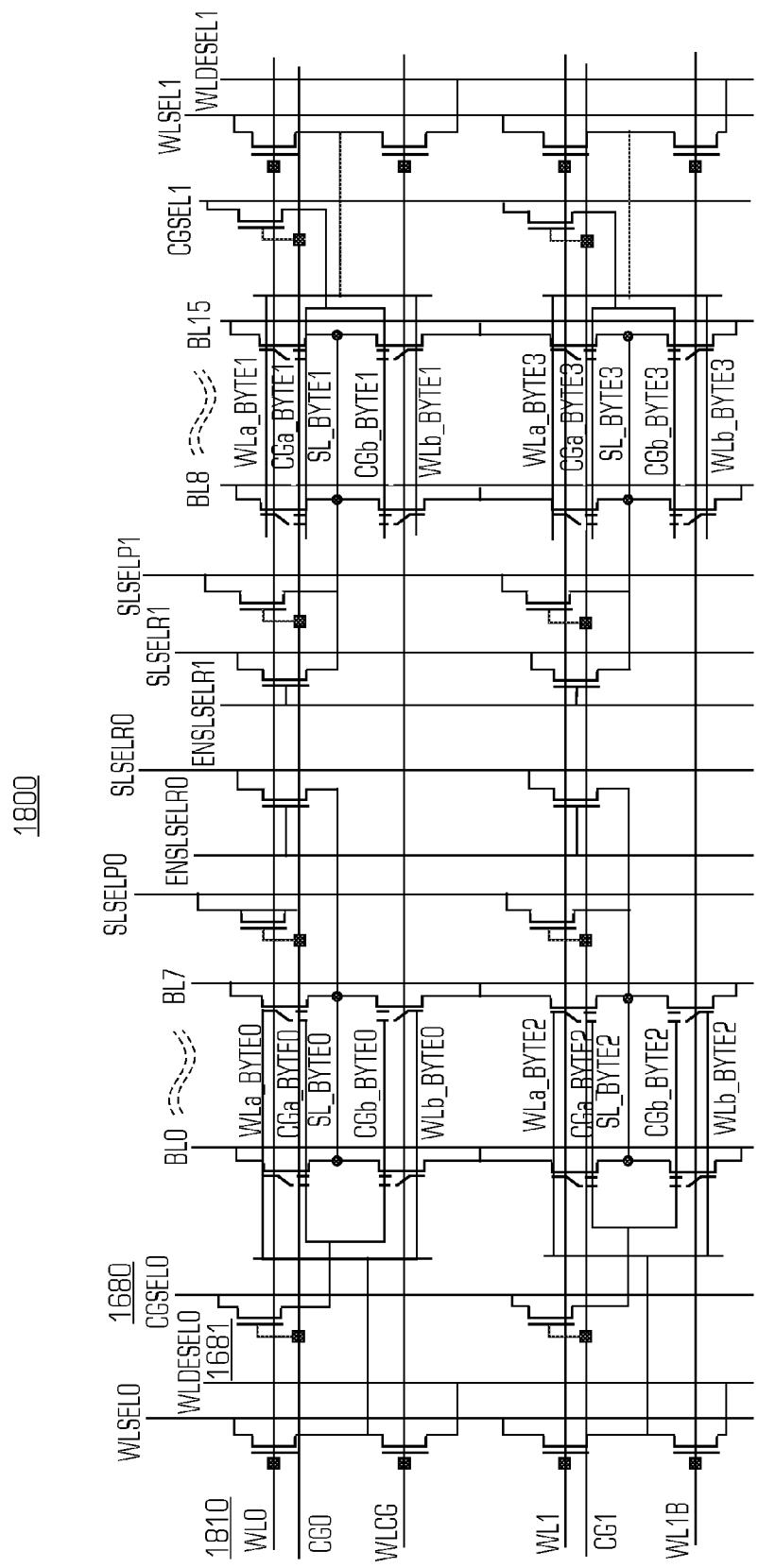
FIG. 18 depicts an embodiment of a flash memory circuit.

With reference to FIG. 18, an embodiment of flash memory circuit 1800 that contains modifications to the flash memory circuit of FIG. 16 is depicted. Many structures in FIG. 18 are identical to those of FIG. 16 and will not be described again. Flash memory circuit 1800 comprises a control gate for each pair of rows, such as control gate line 1810 (CG0) Control gate 1810 (CGO) connects to the gate of transistor 1681, whose source is connected to control gate select line 1680 (CGSEL0). Thus, unlike in FIG. 16, control gate 1810, in conjunction with control gate select line 1680 (CGSEL0), controls the voltage on the control gates of the memory cells in selected byte 1610, including memory cells 1641 and 1642.

A set of specific parameters used to perform erase, program and read operations in flash memory circuit 1800 is shown in Tables 10A-10D below:

TABLE 10A

|  | Selected Byte | | | | | |
|---|---|---|---|---|---|---|
|  | WL selected | WLB selected | WL un-selected | WLB unselected | CG selected | CG unselected |
| ERASE | VWL-E | 0V/VWLB-Ebias | VWL_Ebias/0V | 0V/Vdd | VCG-E | 0V/VCG-Ebias |
| PROGRAM | VWL-P | 0V/VWLB-Pbias | 0V/VWL-Pbias | Vdd/0V | VCG-P | 0VNCG_P bias |
| READ | VWL-R | 0V | 0V | Vdd | VCG-R | VCG_Rbias |

TABLE 10B

|  | WLSEL selected | WLSEL un-selected | CGSEL selected | CGSEL un-selected | SLSELP selected | SLSELP un-selected |
|---|---|---|---|---|---|---|
| ERASE | VWLSEL_E | 0V(*) | 0V/VCGSEL_ENEG | 0V(*) | 0V | 0V(*) |
| PROGRAM | VWLSEL_P | 0V(*) | VCGSEL_P | 0V(*) | VSLSELP-P | 0V(*) |

TABLE 10B-continued

|  | WLSEL selected | WLSEL un-selected | CGSEL selected | CGSEL un-selected | SLSELP selected | SLSELP un-selected |
|---|---|---|---|---|---|---|
| READ | VWLSEL_R | 0V |  | VCGSEL_R VCGSEL_R bias | 0V | 0V |

TABLE 10C

|  | EN_SLSELR selected | SLSELR selected | EN_SLSELR un-selected | SLSELR un-selected |
|---|---|---|---|---|
| ERASE | Vdd | 0V | Vdd | 0V(*) |
| PROGRAM | VSLSELR-Pbias | VSLSELR-Pbias | Vdd | 0V(*) |
| READ | Vdd | 0V | Vdd | 0V |

TABLE 10D

|  | Selected Byte | | |
|---|---|---|---|
|  | BL selected | BL un-selected | BL others un-selected |
| ERASE | 0V | 0V | 0V(*) |
| PROGRAM | IPROG | VINH | 0V(*) |
| READ | VBLR | 0V | 0V |

Figure 19:
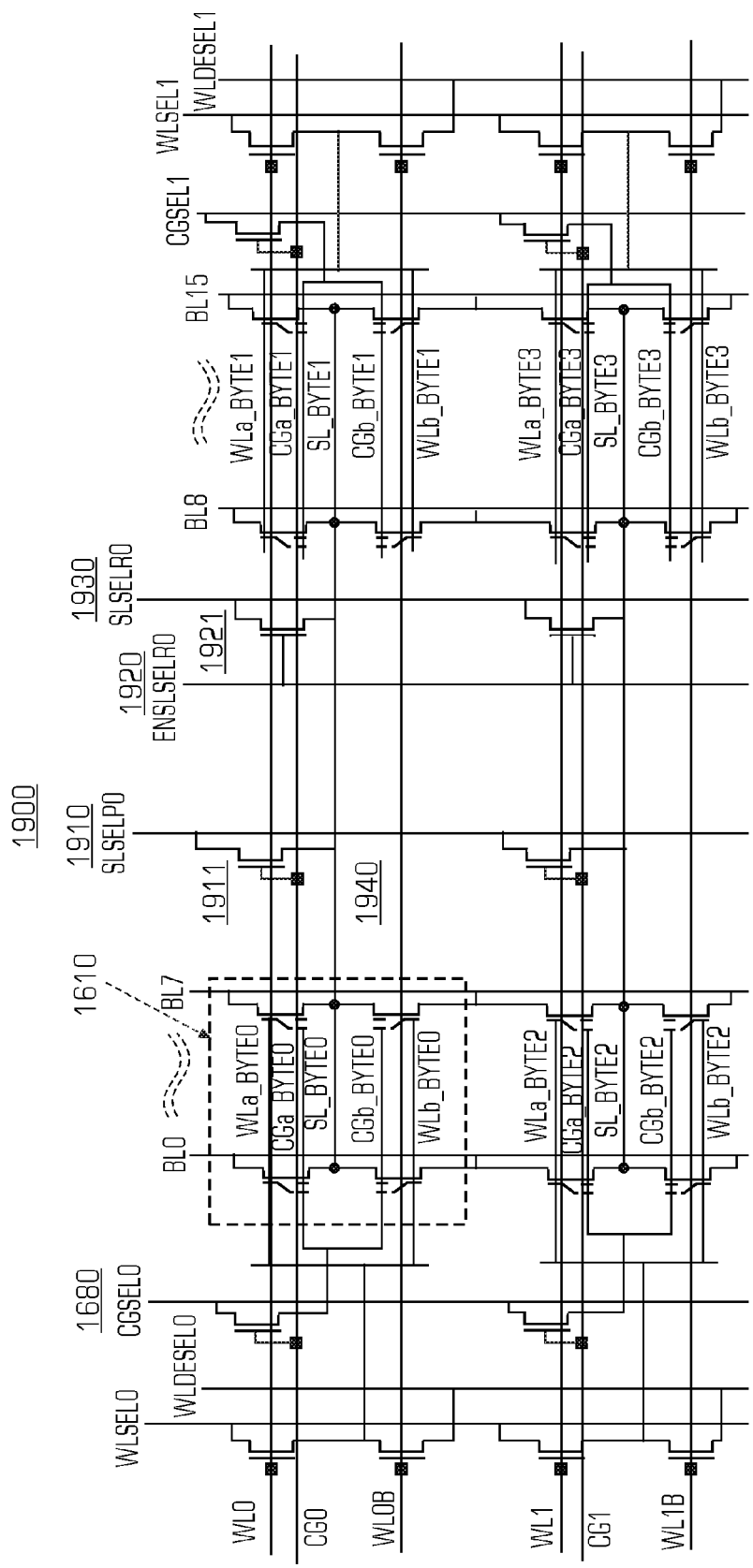
FIG. 19 depicts an embodiment of a flash memory circuit.

ERASE
VWL-E: ~12-13 V
VWL_Ebias: ~1-3 V
VWLB_Ebias: ~1-3 V
VCG-E: ~Vdd to 0 V
VCG-Ebias: ~0 to -8 V V
VWLSEL_E: ~10-12 V
VCGSEL_ENEG: ~-4 to -8 V V
WLDESELx = GND/VWLB-Ebias
READ
VWLSEL_R: ~2.5 V
VBLR: ~0.8-2 V
VWL-R: ~3-4 V
VCG-R: ~3-4 V
VCG-Rbias: ~0-4 V
VCGSEL_R: ~2-4 V
VCGSEL_Rbias: ~0-4 V
WLDESELx: = 0 V
PROG
VWL-P: ~3-4 V
VWL-Pbias: ~0 V
VWLB-Pbias: ~1-3 V
VCG-P: ~12-13 V
VCG-Pbias: ~1-3 V
VWLSEL_P: ~1-2 V
VSLSELP-P: ~4-6 V
VSLSELR-Pbias: ~2-3 V
VCGSEL-P: ~8-10 V
IPROG: ~0.1-3 uA
VINH: ~Vdd V
WLDESELx = GND/VWLB-Pbias With reference to FIG. 19, an embodiment of flash memory circuit 1900 that contains modifications to the flash memory circuit of FIG. 18 is depicted. Many structures in FIG. 19 are identical to those of FIG. 18 and will not be described again. Flash memory circuit 1900 comprises source line program line 1910 (SLSELP0) connected to transistor 1911, enable source line select read line 1920 (ENSLSELR0) connected to transistor 1921, and source line select read line 1930 (SLSELR0) also connected to transistor 1921, as shown in FIG. 19. Here, a common source line 1940 is shared across pairs of rows. For example, source line 1940 is connected to the memory cells of the byte pairs corresponding to bit lines BL0 to BL7 and BL8 to BL15. Thus, both byte pairs can be programmed together with the same shared source line selection.

In the alternative, only one byte pair can be programmed if the other byte pair is unselected (inhibited) through a zero or negative voltage (program inhibit CG voltage) applied to its control gate select line. For example, applying a negative voltage such as -5V to control gate select line 1680 (CG-SEL0) would unselect (inhibit) byte pair 1610 during a programming operation.

Figure 20:
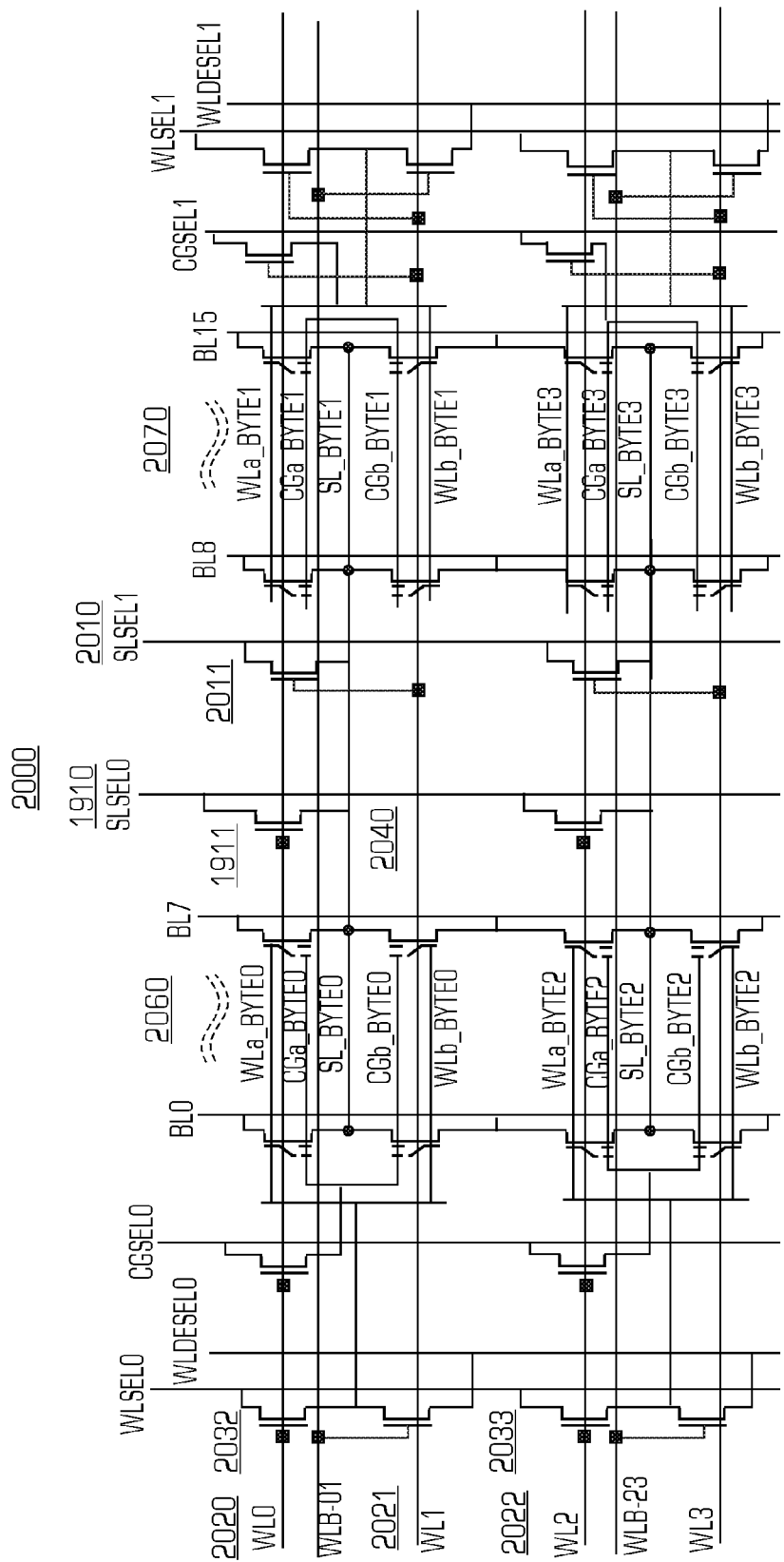
FIG. 20 depicts an embodiment of a flash memory circuit.

With reference to FIG. 20, an embodiment of flash memory circuit 2000 that contains modifications to the flash memory circuit of FIG. 19 is depicted. Many structures in FIG. 20 are identical to those of FIG. 10 and previous figures and will not be described again. Flash memory circuit 2000 comprises source select line 1910 (SLSEL0) connected to transistor 1911, source line select line 2010 (SLSEL1) connected to transistor 2011, and word line 2020 (W10) and word line 2021 (WLB-1) connected to transistor 2032 and transistor 2033 respectively as shown in FIG. 20. The transistor 2032 is for selecting and the transistor 2033 is for de-selecting an internal memory cell word line. Word line 2022 (WL1) connected to transistor 2011 and other select transistor on byte with bitlines BL7-15 2070 that shares source line 2040 with the byte with bitlines BL0-7 2060. Operating condition is more flexible such as for the byte with BL7-15 in de-selected condition with selected shared source line with the separate word line 2022

Figure 21:
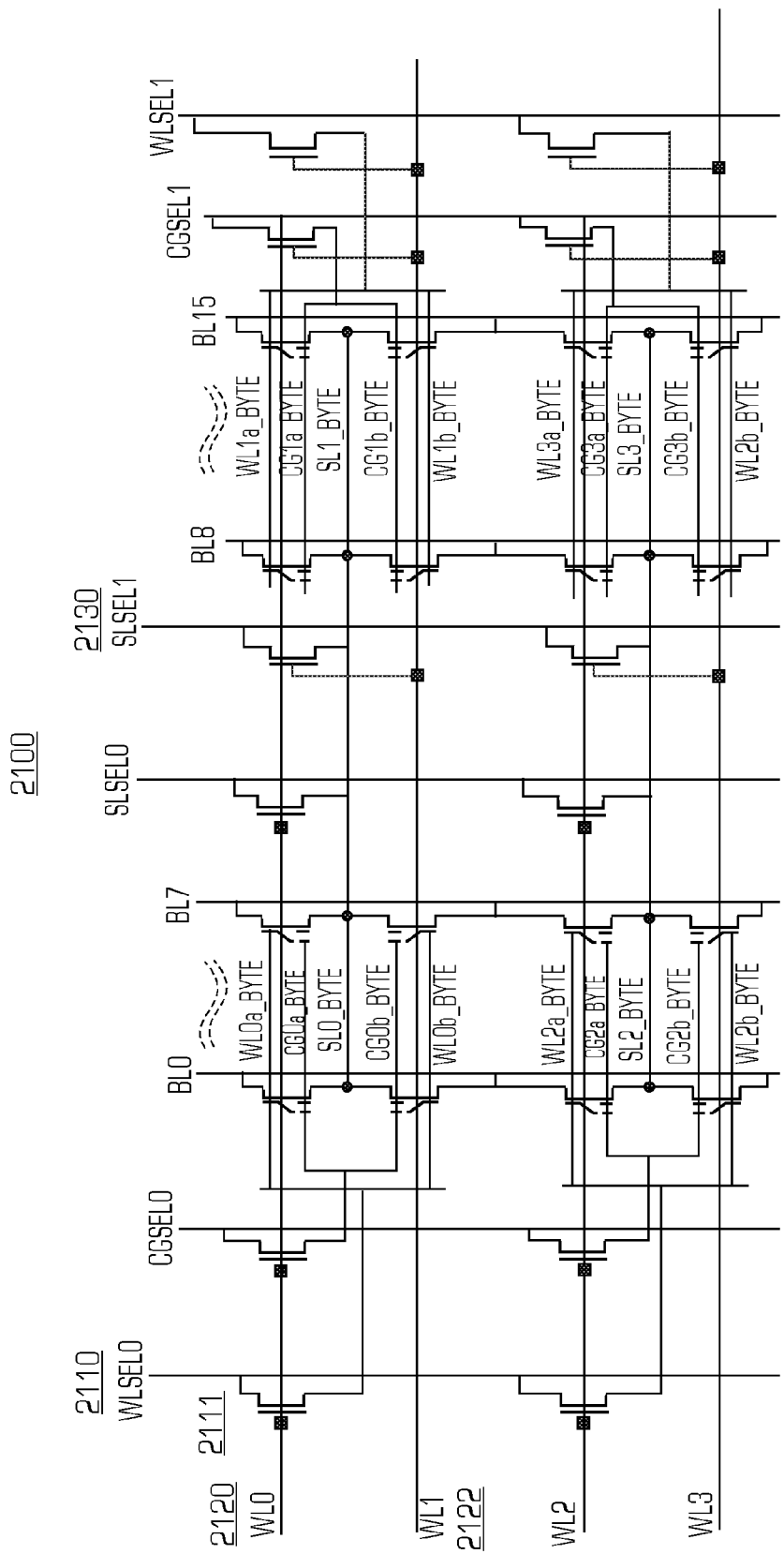
FIG. 21 depicts an embodiment of a flash memory circuit.

With reference to FIG. 21, an embodiment of flash memory circuit 2100 that contains modifications to the flash memory circuit of FIG. 20 is depicted. Many structures in FIG. 21 are identical to those of FIG. 20 and previous figures and will not be described again. Flash memory circuit 2100 comprises word line select line 2110 (WLSEL0) coupled to transistor 2111, and word line 2120. In flash memory circuit 2100, the word line 2021 and the de-select transistor 2033 of FIG. 20 are not required. In this manner, the same functions in FIG. 20 that are performed by two word lines 2020 and 2021 and two transistors 2032 and 2033 are performed by only one word line 2120 and one transistor 2111.

Figure 22:
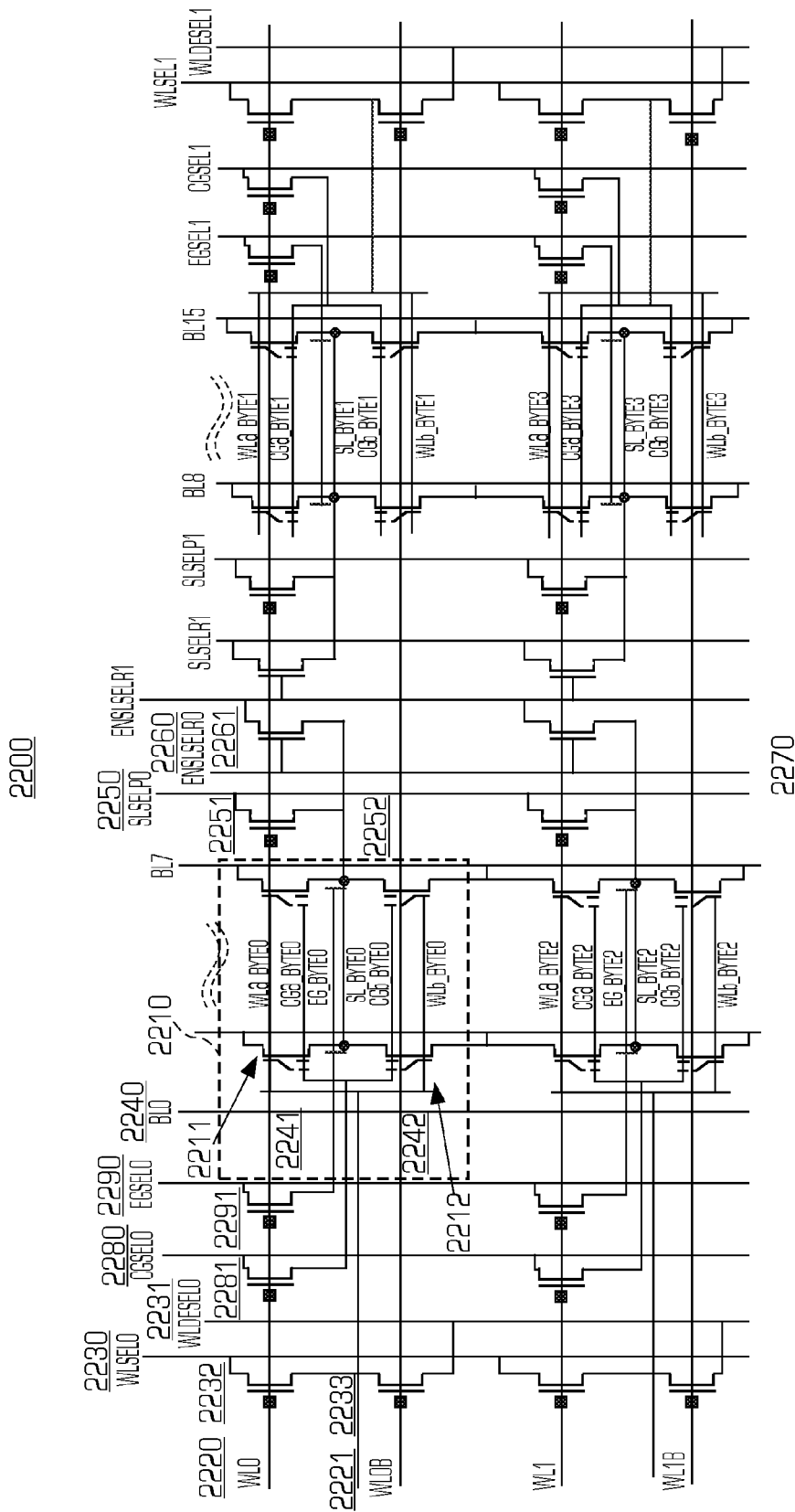
FIG. 22 depicts an embodiment of a flash memory circuit.

With reference to FIG. 22, an embodiment of a flash memory circuit 2200 with EEPROM functionality is depicted. In this embodiment, flash memory circuit 2200 is used with flash memory cells of the type shown in FIG. 3. Description will be made of the operation of selected byte pair 2210. Selected byte pair 2210 comprises two selected bytes of data—a first byte 2211 corresponding to a first word line 2220 (WL0) and eight bit lines (BL0 to BL7) and a second byte 2212 corresponding to a second word line 2221 (WL0B) and eight bit lines (BL0 to BL7). It is to be understood that similar connections and circuitry exist for all other bytes and similar byte pairs in flash memory circuit 2200. Flash memory circuit 2200 comprises a plurality of word lines, such as word line 2220 (also labeled WL0), a plurality of associated word lines, such as word line 2221 (also labeled WL0B), and a plurality of bit lines, such as bit line 2240 (also labeled BL0). Word lines and associated word lines would have shared a source line in the prior art designs.

Flash memory circuit 2200 also comprises word line select line 2230 (also labeled WLSEL0) coupled to transistor 2232 and transistor 2233, word line deselect line 2231 (also labeled WLDESEL0), source line select program line 2250 (also labeled SLSELP0) coupled to transistor 2251, enable source line select read line 2260 (also labeled EN_SLSELR0) coupled to transistor 2261, and source line select read line 2270 (also labeled SLSELR0). In this example, bit line 2240 is coupled to memory cell 2241 (which, in this example, is of the type of memory cell depicted in FIG. 3). Flash memory circuit also comprises control gate select line 2280 (also labeled CGSEL0) coupled to transistor 2281.

Flash memory circuit 2200 also comprises erase gate select line 2290 (also labeled EGSEL0) connected to transistor 2291, which also is coupled to word line 2220 (WL0) as shown.

Unlike in the prior art, selected byte pair 2210 can be erased without any other byte or byte pair in memory circuit 2200 being erased, and selected byte pair 2210 can be programmed without any other byte or byte pair in memory circuit 2200 being programmed. Thus, EEPROM functionality is achieved using flash memory cells. By contrast, in the prior art, the bytes corresponding to bit lines BL8 to BL15 and words line WL0 and WL0B also would have been programmed at the same time as selected byte pair 2210.

Specifically, unlike in the prior art, each word line does not connect directly to each memory cell in its row and corresponding row. For example, word line 2220 (WL0) is connected to the gate of NMOS transistor 2232, and the source of NMOS transistor 2232 is connected to word line select line 2230 (WLSEL0) and the drain of NMOS transistor 2232 is connected to internal word line of memory cell 2241 and memory cell 2242. Thus, word line 2220 only electrically connects to memory cell 2241 and memory cell 2242 when word line select line 2230 (WLSEL0) is asserted. Similarly, control gate select line 2280 (CGSEL0) is connected to the source of transistor 2281, and the gate of transistor 2281 is coupled to word line 2220 (WL0), with the drain of transistor 2281 connected to the control gates of the memory cells of selected byte pair 2210 (including memory cells 2241 and 2242). In this manner, a word line can access just one byte pair of memory cells instead of all memory cells in a row and corresponding row.

Similarly, each source line does not connect directly to each memory cell in its row. For example, SLBYTE0 2252 (internal source line of memory cells) is connected only to memory cell 2241 and memory cell 2242 and other memory cells in selected byte pair 2210 and not to other memory cells outside of selected byte pair 2210. In this manner, a source line can access just one byte pair of memory cells instead of all memory cells in a row and corresponding row. The transistor type (HV or IO or FG) and gate oxide of the select transistors are similar to that of FIGS. 5 and 16.

A set of specific parameters used to perform erase, program and read operations are shown in Tables 11A-11D below:

TABLE 11A

| | Selected Byte | | | |
|---|---|---|---|---|
| | WL selected | WLB selected | WL un-selected | WLB unselected |
| ERASE | VWL-E | 0V/VWLB-Ebias | VWL Ebias/0V | 0V/Vdd |
| PROGRAM | VWL-P | 0V/VWLB-Pbias | 0V/VWL-Pbias | Vdd/0V |
| READ | VWL-R | 0V | 0V | Vdd |

TABLE 11B

| | WLSEL selected | WLSEL un-selected | CGSEL selected | CGSEL un-selected | EGSEL selected | EGSEL Un-selected | SLSELP selected | SLSELP un-selected |
|---|---|---|---|---|---|---|---|---|
| ERASE | VWLSEL_E | 0V(*) | 0V/VCGSEL ENEG | 0V(*) | VSLSELP-E | 0V(*) | 0V | 0V(*) |
| PROGRAM | VWLSEL_P | 0V(*) | VCGSEL_P | 0V(*) | VSLSELP-P | 0V(*) | VSLSELP-P | 0V(*) |
| READ | VWLSEL_R | 0V | VCGSEL_R | VCGSEL_Rbias | VSLSELP-R | VCG_R bias | 0V | 0V |

TABLE 11C

| | EN_SLSELR selected | SLSELR selected | EN_SLSELR un-selected | SLSELR un-selected |
|---|---|---|---|---|
| ERASE | Vdd | 0V | Vdd | 0V(*) |
| PROGRAM | VSLSELR-Pbias | VSLSELR-Pbias | Vdd | 0V(*) |
| READ | Vdd | 0V | Vdd | 0V |

TABLE 11D

| | Selected Byte | | |
|---|---|---|---|
| | BL selected | BL un-selected | BL others un-selected |
| ERASE | 0V | 0V | 0V(*) |
| PROGRAM | IPROG | VINR | 0V(*) |
| READ | VBLR | 0V | 0V |

ERASE
VWL-E: ~12-13 V
VWL_Ebias: ~1-3 V
VWLB_Ebias: ~1-3 V
VWLSEL_E: ~10-12 V
VCGSEL_ENEG: ~-4 to -8V V
WLDESELx = GND/VWLB-Ebias
VEGSEL_E: ~10-12 V
READ
VWLSEL_R: ~2.5 V
VBLR: ~0.8-2 V
VWL-R: ~3-4 V
VCGSEL_R: ~2-4 V
VCGSEL_Rbias: ~0-4 V
WLDESELx 0 V
VEGSEL_R: ~0-2 V
VEGSEL_Rbias: ~0-2 V
PROG
VWL-P: ~12-13 V
VWL-Pbias: ~1-3 V
VWLB-Pbias: ~1-3 V
VWLSEL_P: ~1-2 V
VSLSELP-P: ~4-6 V
VSLSELR-Pbias: ~2-3 V TABLE 11D-continued

| | Selected Byte | | |
|---|---|---|---|
| | BL selected | BL un-selected | BL others un-selected |
| VCGSEL-P: ~8-10 V | | | |
| IPROG: ~0.1-3 uA | | | |
| VINH: ~Vdd V | | | |
| WLDESELx = GND/VWLB-Pbias | | | |
| VEGSEL_P: ~4-6 V | | | |

Figure 23:
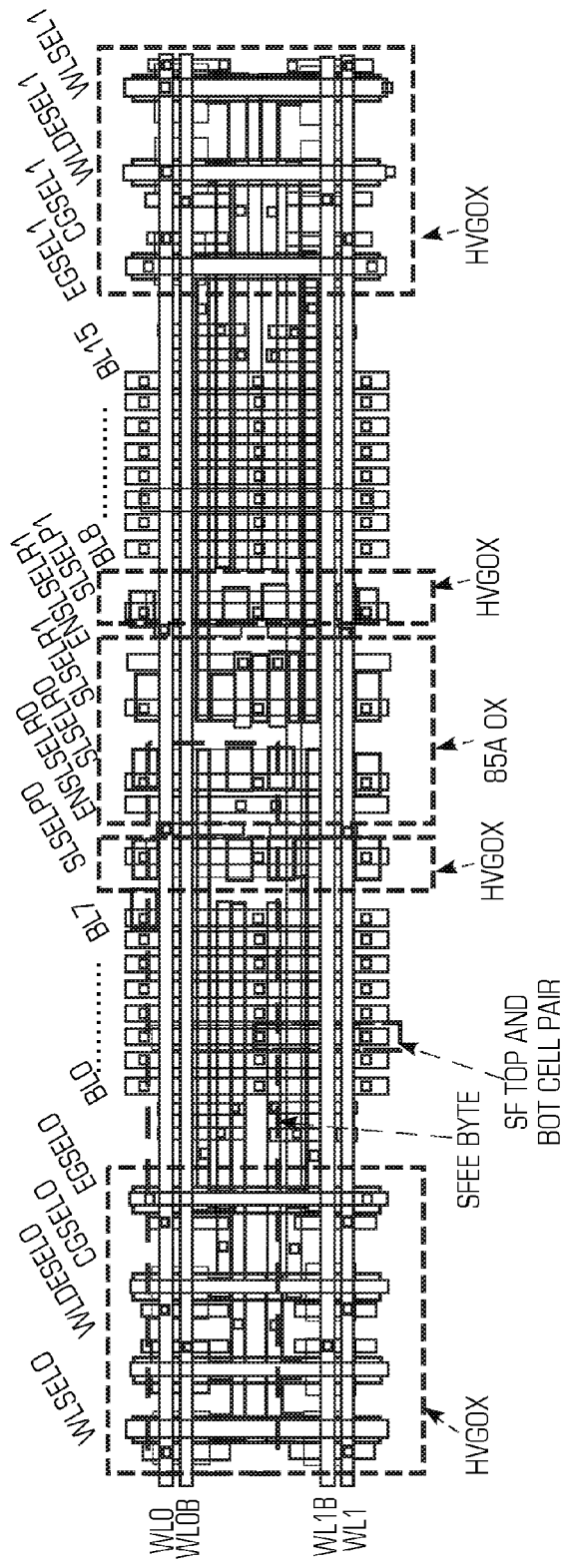
FIG. 23 is a layout diagram of an embodiment of a flash memory circuit.

With reference to FIG. 23, an embodiment of a physical layout 2300 of the design shown in FIG. 22 is depicted. Word lines (WLx) are done horizontally in metal 2 layer and select and de-select lines (WLSELx, WLDESELx, SLSELx, ENSLSELx, CGSELx, EGSELx) are done vertically in metal 1 layer or metal 3 layer. Source lines are done in salicided diffusion or silicided poly.

Figure 24:
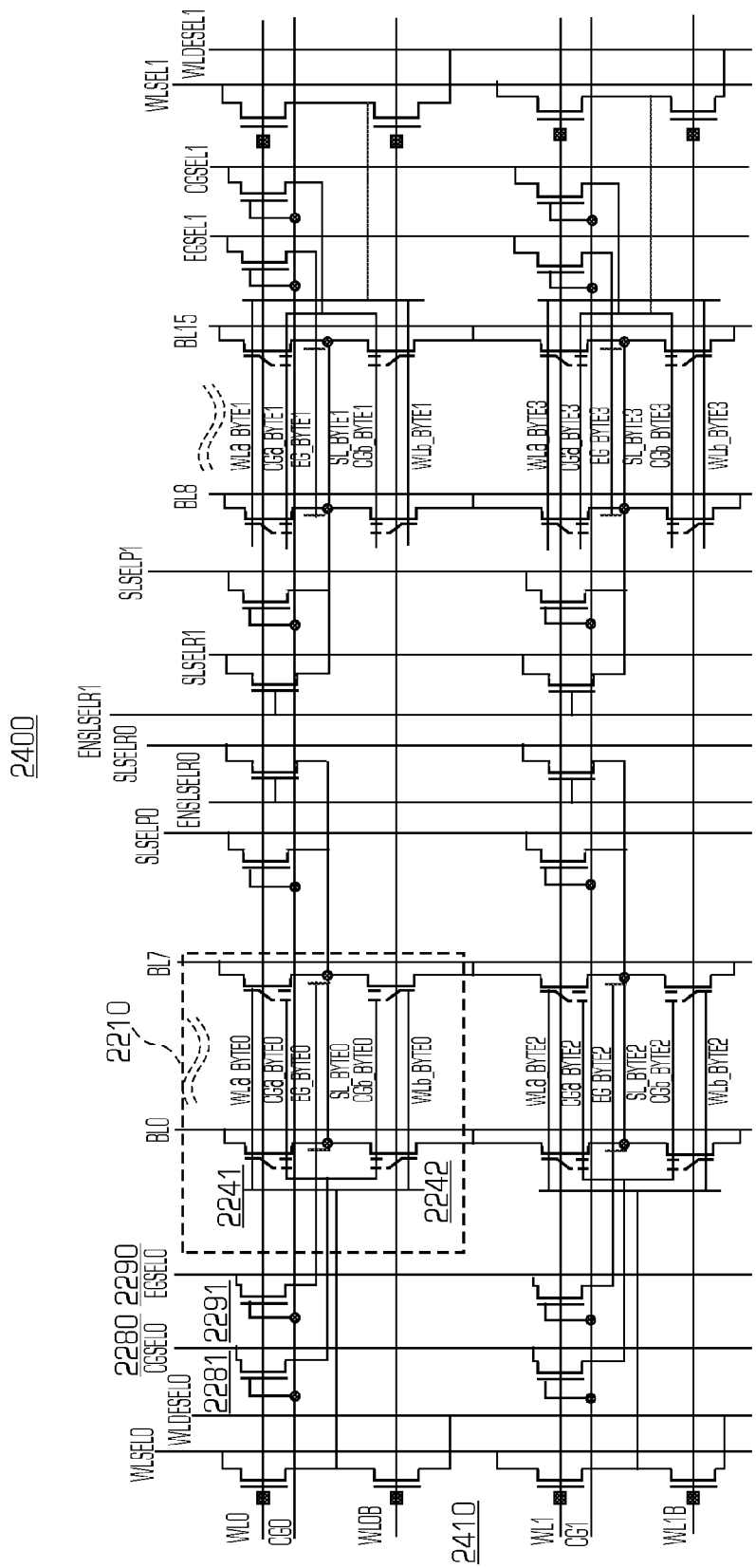
FIG. 24 depicts an embodiment of a flash memory circuit.

With reference to FIG. 24, an embodiment of flash memory circuit 2400 that contains modifications to the flash memory circuit of FIG. 22 is depicted. Many structures in FIG. 24 are identical to those of FIG. 22 and will not be described again. Flash memory circuit 2400 comprises a control gate for each pair of rows, such as control gate line 2410 (CG0) Control gate 2410 (CGO) connects to the gate of transistor 2281, whose source is connected to control gate select line 2280 (CGSEL0). Thus, unlike in FIG. 22, control gate 2410, in conjunction with control gate select line 2280 (CGSEL0), controls the voltage on the control gates of the memory cells in selected byte 2210, including memory cells 2241 and 2242. The control gate line 2410 (CG0) also connects to the gate of the transistor 2291, whose source is connected to the erase gate select line 2290. Thus, unlike in FIG. 22, control gate 2410, in conjunction with erase gate select line 2280 (EGSEL0), controls the voltage on the erase gates of the memory cells in selected byte 2210, including memory cells 2241 and 2242. In another embodiment, an erase gate line EG0 instead of the control gate line CG0 2410 is connected to the gate of the transistor 2291.

Figure 25:
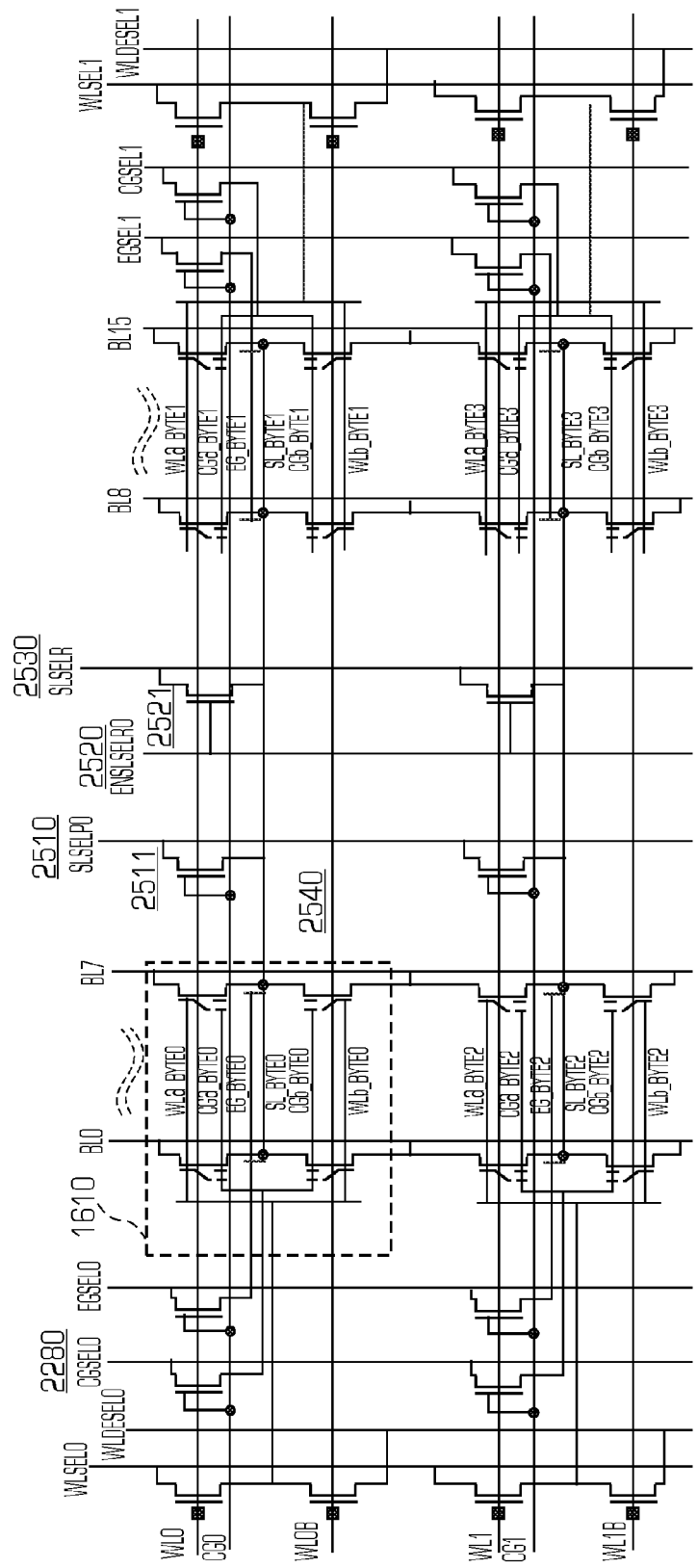
FIG. 25 depicts an embodiment of a flash memory circuit.

With reference to FIG. 25, an embodiment of flash memory circuit 2500 that contains modifications to the flash memory circuit of FIG. 24 is depicted. Many structures in FIG. 25 are identical to those of FIG. 24 and will not be described again. Flash memory circuit 2500 comprises source line program line 2510 (SLSELP0) connected to transistor 2511, enable source line select read line 2520 (ENSLSELR0) connected to transistor 2521, and source line select read line 2530 (SLSELR0) also connected to transistor 2521, as shown in FIG. 25. Here, a common source line is shared across pairs of rows. For example, source line 2540 is connected to the memory cells of the byte pairs corresponding to bit lines BL0 to BL7 and BL8 to BL15. Thus, both byte pairs can be programmed together with the same shared source line.

In the alternative, only one byte pair can be programmed if the other byte pair is unselected (inhibited) through a negative voltage (program inhibit CG voltage) applied to its control gate select line. For example, applying a negative voltage such as −5V to control gate select line 1680 (CGSEL0) would unselect (inhibit) byte pair 1610 during a programming operation.

In an alternative embodiment of flash memory circuits described above in FIGS. 4-25, a different type of metal can be used for horizontal lines and vertical lines.

In an alternative embodiment of flash memory circuits described above in FIGS. 4-25, a local pickup can be made of poly diffusion material and the middle level metal can be made of a type of metal.

In an alternative embodiment of flash memory circuits described above in FIGS. 4-25, a source line can be shared by more than two bytes of memory cells.

What is claimed is:

1. A non-volatile memory device comprising:
   an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
   a word line select line for controlling access by a word line to the byte of memory cells;
   wherein the device is configured to erase a byte of memory cells without any other memory cells in the array being concurrently erased.

2. The device of claim 1, further comprising: a word line deselect line for preventing access by a word line to the byte of memory cells.

3. The device of claim 2, further comprising: a first source line select line for controlling access by a first source line to the byte of memory cells.

4. The device of claim 3, further comprising: a second source line select line for controlling access by a second source line to the byte of memory cells, the first source line select line being used for read operations and the second source line select line being used for program operations.

5. The device of claim 1, further comprising: a first source line select line for controlling access by a first source line to the byte of memory cells.

6. The device of claim 5, further comprising: a second source line select line for controlling access by a second source line to the byte of memory cells, the first source line select line being used for read operations and the second source line select line being used for program operations.

7. The device of claim 1, further comprising: a word line deselect transistor for preventing access by a word line to the byte of memory cells.

8. The device of claim 1, wherein within the byte, a number of cells less than the number of cells in the byte can be read or programmed.

9. The device of claim 8, wherein the read or program is done until all cells within the byte is completed.

10. The device of claim 1, further comprising complementary bitline and bitline bar for a unit cell pair sharing same source line.

11. The device of claim 10, wherein the complementary bitline is used to pull down the source line to a low voltage for the selected bitline during a read operation.

12. The device of claim 1, wherein a bitline is used to pull down the source line to a low voltage for the selected bitline during a read operation.

13. A non-volatile memory device comprising:
   an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
   a first source line select line for controlling access by a first source line to the byte of memory cells;
   wherein the device is configured to erase a byte of memory cells without any other memory cells in the array being concurrently erased.

14. The device of claim 13, further comprising: a second source line select line for controlling access by a second source line to the byte of memory cells, the first source line select line being used for read operations and the second source line select line being used for program operations.

15. The device of claim 13, further comprising: a second source line select transistor for controlling access by a second source line to the byte of memory cells, the first source line select line being used for read operations and the second source line select line being used for program operations.

16. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
a word line select transistor for controlling access by a word line to the byte of memory cells;
wherein the device is configured to erase a byte of memory cells without any other memory cells in the array being concurrently erased.

17. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
a first source line select transistor for controlling access by a first source line to the byte of memory cells;
wherein the device is configured to erase a byte of memory cells without any other memory cells in the array being concurrently erased.

18. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line;
wherein each column of memory cells is coupled to two bit lines; and
wherein the device is configured to erase a byte of memory cells without any other memory cells in the array being concurrently erased.

19. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
a source line select read line coupled to a pair of bytes of memory cells that enable the reading of both bytes at the same time;
wherein the device is configured to erase a byte of memory cells without any other memory cells in the array being concurrently erased.

20. The device of claim 19, further comprising an enable source line select read line for enabling the use of the source line select read line.

21. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line; and
a word line for accessing two rows of memory cells;
wherein the device is configured to erase a byte of memory cells without any other memory cells in the array being concurrently erased.

22. The device of claim 21, further comprising a word line select line for enabling the word line.

23. The device of claim 21, further comprising a transistor for enabling the word line.

24. The device of claim 21, further comprising a transistor for enabling the programming of two pairs of bytes of memory cells.

25. The device of claim 21, further comprising a transistor for enabling the reading of two pairs of bytes of memory cells.

26. The device of claim 21, further comprising a transistor for enabling the programming of a pair of bytes of memory cells.

27. The device of claim 21, further comprising a transistor for enabling the reading of a pair of bytes of memory cells.

28. A non-volatile memory device comprising:
an array of memory cells arranged in rows and columns, each row corresponding to a word line and each column corresponding to a bit line, and each memory cell comprising a floating gate, a bit line terminal for connecting to a bit line, a word line terminal for connecting to a word line, and a source line terminal for connecting to a source line;
wherein half of the rows of memory cells are not used during operation of the device; and
wherein the device is configured to erase a byte of memory cells without any other memory cells in the array being concurrently erased.

29. A non-volatile memory device comprising:
an array of memory cells arranged in rows and columns, each row corresponding to a word line and each column corresponding to a bit line, and each memory cell comprising a floating gate, a control gate for connecting to a control gate line, a bit line terminal for connecting to a bit line, a word line terminal for connecting to a word line, and a source line terminal for connecting to a source line; and
a source line select read line coupled to a pair of bytes of memory cells that enable the reading of both bytes at the same times;
wherein the device is configured to erase a byte of memory cells without any other memory cells in the array being concurrently erased.

30. The device of claim 29, further comprising an enable source line select read line for enabling the use of the source line select read line.

31. The device of claim 29, further comprising a transistor for de-selecting an internal memory cell word line, such that memory cells in a first row can be selected and memory cells in a second row sharing a source line with the first row can be de-selected.

32. A non-volatile memory device comprising:
an array of memory cells arranged in rows and columns, each row corresponding to a word line and each column corresponding to a bit line, and each memory cell comprising a floating gate, a control gate for connecting to a control gate line, a bit line terminal for connecting to a bit line, a word line terminal for connecting to a word line, and a source line terminal for connecting to a source line; and a control gate select line for controlling access by a word line to the control gate of each memory cell in the byte of memory cells;

wherein the device is configured to erase a byte of memory cells without any other memory cells in the array being concurrently erased.

33. The device of claim 32, further comprising: a word line select line for controlling access by a word line to the byte of memory cells.

34. The device of claim 33, further comprising: a word line deselect line for preventing access by a word line to the byte of memory cells.

35. The device of claim 32, further comprising: a first source line select line for controlling access by a first source line to the byte of memory cells.

36. The device of claim 33, further comprising: a first source line select line for controlling access by a first source line to the byte of memory cells.

37. The device of claim 34, further comprising: a first source line select line for controlling access by a first source line to the byte of memory cells.

38. The device of claim 35, further comprising: a second source line select line for controlling access by a second source line to the byte of memory cells, the first source line select line being used for read operations and the second source line select line being used for program operations.

39. The device of claim 36, further comprising: a second source line select line for controlling access by a second source line to the byte of memory cells, the first source line select line being used for read operations and the second source line select line being used for program operations.

40. The device of claim 37, further comprising: a second source line select line for controlling access by a second source line to the byte of memory cells, the first source line select line being used for read operations and the second source line select line being used for program operations.

41. The device of claim 32, further comprising: a word line select transistor for controlling access by a word line to the byte of memory cells.

42. The device of claim 41, further comprising: a word line deselect transistor for preventing access by a word line to the byte of memory cells.

43. The device of claim 32, further comprising: a first source line select transistor for controlling access by a first source line to the byte of memory cells.

44. The device of claim 41, further comprising: a first source line select transistor for controlling access by a first source line to the byte of memory cells.

45. The device of claim 42, further comprising: a first source line select transistor for controlling access by a first source line to the byte of memory cells.

46. The device of claim 43, further comprising: a second source line select transistor for controlling access by a second source line to the byte of memory cells, the first source line select transistor being used for read operations and the second source line select transistor being used for program operations.

47. The device of claim 44, further comprising: a second source line select transistor for controlling access by a second source line to the byte of memory cells, the first source line select transistor being used for read operations and the second source line select transistor being used for program operations.

48. The device of claim 45, further comprising: a second source line select transistor for controlling access by a second source line to the byte of memory cells, the first source line select transistor being used for read operations and the second source line select transistor being used for program operations.

49. The device of claim 32, further comprising two bytes sharing one source line.

50. The device of claim 49, wherein an unselected byte is inhibited by an inhibit CG voltage in programming.

51. The device of claim 33, wherein within the byte, a number of cells less than the number of cells in the byte can be read or programmed.

52. The device of claim 51, wherein the read or program is done until all cells within the byte is completed.

53. The device of claim 33, further comprising complementary bitline and bitline bar for a unit cell pair sharing same source line.

54. The device of claim 53, wherein the complementary bitline is used to pull down the source line to a low voltage for the selected bitline during a read operation.

55. The device of claim 33, wherein the word lines for the half of the rows are connected to ground bias.

56. A non-volatile memory device comprising:
an array of memory cells arranged in rows and columns, each row corresponding to a word line and each column corresponding to a bit line, and each memory cell comprising a floating gate, a control gate for connecting to a control gate line, a bit line terminal for connecting to a bit line, a word line terminal for connecting to a word line, and a source line terminal for connecting to a source line;

wherein a bitline is used to pull down the source line to a low voltage for the selected bitline during a read operation; and wherein the device is configured to erase a byte of memory cells without any other memory cells in the array being concurrently erased.

57. A non-volatile memory device comprising:
an array of memory cells arranged in rows and columns, each row corresponding to a word line and each column corresponding to a bit line, and each memory cell comprising a floating gate, a control gate for connecting to a control gate line, an erase gate for connecting to an erase gate line, a bit line terminal for connecting to a bit line, a word line terminal for connecting to a word line, and a source line terminal for connecting to a source line;

wherein a bitline is used to pull down the source line to a low voltage for the selected bitline during a read operation; and wherein the device is configured to erase a byte of memory cells without any other memory cells in the array being concurrently erased.

58. A non-volatile memory device comprising:
an array of memory cells arranged in rows and columns, each row corresponding to a word line and each column corresponding to a bit line, and each memory cell comprising a floating gate, a control gate for connecting to a control gate line, an erase gate for connecting to an erase gate line, a bit line terminal for connecting to a bit line, a word line terminal for connecting to a word line, and a source line terminal for connecting to a source line; and a source line select read line coupled to a pair of bytes of memory cells that enable the reading of both bytes at the same time;

wherein the device is configured to erase a byte of memory cells without any other memory cells in the array being concurrently erased.

59. The device of claim 58, further comprising an enable source line select read line for enabling the use of the source line select read line.

60. A non-volatile memory device comprising:
an array of memory cells arranged in rows and columns, each row corresponding to a word line and each column corresponding to a bit line, and each memory cell comprising a floating gate, a control gate for connecting to a control gate line, an erase gate for connecting to an erase gate line, a bit line terminal for connecting to a bit line, a word line terminal for connecting to a word line, and a source line terminal for connecting to a source line; and
a control gate select line for controlling access by a word line to the control gate of each memory cell in the byte of memory cells;
wherein the device is configured to erase a byte of memory cells without any other memory cells in the array being concurrently erased.

61. The device of claim 60, further comprising: an erase gate select line for controlling access by a word line to the erase gate of each memory cell in the byte of memory cells.

62. The device of claim 61, further comprising: a word line select line for controlling access by a word line to the byte of memory cells.

63. The device of claim 62, further comprising: a word line deselect line for preventing access by a word line to the byte of memory cells.

64. The device of claim 61, further comprising: a first source line select line for controlling access by a first source line to the byte of memory cells.

65. The device of claim 62, further comprising: a first source line select line for controlling access by a first source line to the byte of memory cells.

66. The device of claim 63, further comprising: a first source line select line for controlling access by a first source line to the byte of memory cells.

67. The device of claim 64, further comprising: a second source line select line for controlling access by a second source line to the byte of memory cells, the first source line select line being used for read operations and the second source line select line being used for program operations.

68. The device of claim 65, further comprising: a second source line select line for controlling access by a second source line to the byte of memory cells, the first source line select line being used for read operations and the second source line select line being used for program operations.

69. The device of claim 66, further comprising: a second source line select line for controlling access by a second source line to the byte of memory cells, the first source line select line being used for read operations and the second source line select line being used for program operations.

70. The device of claim 60, further comprising: an erase gate select transistor for controlling access by a word line to the erase gate of each memory cell in the byte of memory cells.

71. The device of claim 70, further comprising: a word line select transistor for controlling access by a word line to the byte of memory cells.

72. The device of claim 71, further comprising: a word line deselect transistor for preventing access by a word line to the byte of memory cells.

73. The device of claim 70, further comprising: a first source line select transistor for controlling access by a first source line to the byte of memory cells.

74. The device of claim 71, further comprising: a first source line select transistor for controlling access by a first source line to the byte of memory cells.

75. The device of claim 72, further comprising: a first source line select transistor for controlling access by a first source line to the byte of memory cells.

76. The device of claim 73, further comprising: a second source line select transistor for controlling access by a second source line to the byte of memory cells, the first source line select transistor being used for read operations and the second source line select transistor being used for program operations.

77. The device of claim 74, further comprising: a second source line select transistor for controlling access by a second source line to the byte of memory cells, the first source line select transistor being used for read operations and the second source line select transistor being used for program operations.

78. The device of claim 75, further comprising: a second source line select transistor for controlling access by a second source line to the byte of memory cells, the first source line select transistor being used for read operations and the second source line select transistor being used for program operations.

79. The device of claim 60, further comprising two bytes sharing one source line.

80. The device of claim 79, wherein the unselected byte is inhibited by an inhibit CG voltage during programming.

81. The device of claim 62, wherein within the byte, a number of cells less than the number of cells in the byte can be read or programmed.

82. The device of claim 81, wherein the read or program is done until all cells within the byte is completed.

83. The device of claim 62, further comprising complementary bitline and bitline bar for a unit cell pair sharing same source line.

84. The device of claim 82, wherein the complementary bitline is used to pull down the source line to a low voltage for the selected bitline during a read operation.

* * * * *